US006495644B1

(12) United States Patent
Chen et al.

(10) Patent No.: US 6,495,644 B1
(45) Date of Patent: Dec. 17, 2002

(54) ELECTROLUMINISCENT CONJUGATED POLYMERS MODIFIED WITH HIGH ELECTRONEGATIVE HETEROCYCLIC MOIETIES AND THEIR APPLICATIONS IN POLYMERIC LIGHT EMITTING DIODES

(75) Inventors: Show-An Chen, Hsinchu (TW); Yuh-Zheng Lee, Hsinchu (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 09/480,900

(22) Filed: Jan. 11, 2000

(30) Foreign Application Priority Data

May 13, 1999 (TW) .......................................... 88107746

(51) Int. Cl.[7] .................................................. C08F 26/06
(52) U.S. Cl. ........................ 526/258; 526/256; 526/259; 526/270
(58) Field of Search ................................ 526/256, 258, 526/259, 270

(56) References Cited

U.S. PATENT DOCUMENTS

| | | | | |
|---|---|---|---|---|
| 5,514,878 A | * | 5/1996 | Holmes et al. ................. | 25/40 |
| 5,558,904 A | * | 9/1996 | Hsieh et al. .................... | 427/66 |
| 5,807,974 A | * | 9/1998 | Kim et al. ...................... | 528/366 |
| 5,902,689 A | * | 5/1999 | Vleggaar et al. ............... | 428/690 |

OTHER PUBLICATIONS

Bao et al., "Novel Oxadiazole Side chain conjugated Polymers as Single–Layer Light–Emitting Diodes with Improved Quantum Efficiencies", Chemistry of materials 10:1201–1204, 1998.

Chen et al., "Poly(phenylene Vinylene)s Modified with 2,5–Diphenyl–1,3,4–Oxadiazole Moieties as Electroluminescent Materials", Int'l Conf on Organic Electroluminescent Materials, 9/14–17/96 Rochester, NY.

\* cited by examiner

Primary Examiner—David W. Wu
Assistant Examiner—William Cheung
(74) Attorney, Agent, or Firm—Fish & Richardson P.C.

(57) ABSTRACT

This invention provides a method for syntheses of new electroluminescent conjugated polymers modified with high electronegative heterocyclic groups (such as 1,3,4-oxadiazole-diyl, 1,3,4-thiadiazole-diyl, and 1,2,4-triazole-diyl). These electroluminescent polymers (homopolymers, statistical copolymers or block coplymers) are obtained by polymerization of bis(halomethyl) arenes modified with heterocyclic groups via the Wessling precursor route, Gilch side chain route, Wittig reaction or Wittig-Hornor reaction. By a proper selection of the monomers and their ratios in the polymerization, the emissive polymers (fully conjugated or limited conjugating length) covering the full visible range even extending to the near-IR range can be prepared. The polymeric light emitting diodes (PLED) with these materials as emissive layer or electron transport layer have high external quantum efficiency and can be used as indicators and displays for cellular phones, pagers, portable computer, wristwatch, toys, etc.

48 Claims, 9 Drawing Sheets

ELECTROLUMINISCENT CONJUGATED POLYMERS MODIFIED WITH HIGH ELECTRONEGATIVE HETEROCYCLIC MOIETIES AND THEIR APPLICATIONS IN POLYMERIC LIGHT EMITTING DIODES

FIELD OF THE INVENTION

The present invention is related to electroluminescent conjugated polymers modified with high electronegative heterocyclic groups suitable for use in the fabrication of polymeric light emitting diodes (PLED).

BACKGROUND OF THE INVENTION

The research of organic light emitting diodes started from 1963 by Pope et al (L. Chem. Phys. 38 (1963) 2042) using the single crystal of anthracene as the electroluminescent material, which emit blue light under high voltage. Although many scholars carried on the research and improvement (Phys. Rev. Lett. 14 (1965) 229; Sol. State Comm. 32 (1979) 683; Thin Solid Films 94 (1982) 476), the operating voltage was still too high, and the rate of energy conversion was low, hence there was little value for its application.

In the year 1987, Tang et al (Appl. Phys. Lett., 51 (1987) 914) made organic light emitting diodes having a structure of ITO/Diamine/$Alq_3$/Mg:Ag by using evaporation, wherein ITO is a transparent electroconductive indium/tin oxide, $Alq_3$ is tris(8-hydroxyquinoline) aluminum. This device can achieve external quantum efficiency of 1% and brightness of 1000 $cd/m^2$ at 10V, which motivates a fast development in the research of organic light emitting diodes. Two years later, the research group of Carvendish laboratory in the Cambridge University used poly(phenylene vinylene) (hereinafter abbreviated as PPV) as the light emissive material, ITO as a positive electrode and Ca as a negative electrode to obtain a light emitting diode with a structure of ITO/PPV/Ca, which emits yellowish green light. The PPV has an external quantum efficiency 0.05% (Nature, 347 (1993) 539; U.S. Pat. No. 5,247,190 (1993); U.S. Pat. No. 5,425,125 (1995); U.S. Pat. No. 5,401,827 (1995)). The simplest kind of organic light emitting diode device has a single organic emissive layer sandwiched between a transparent electrode (as a positive electrode) and a metal electrode (as a negative electrode). In order to improve the electroluminescent (EL) efficiency of the organic light emitting diode devices, these devices can contain two organic layers, the first layer being a hole transport layer, and the second layer being the organic emissive layer; or the first layer being the organic emissive layer, and the second layer being an electron transport layer. These two layers are then placed between a transparent electrode (as the positive electrode) and a metal electrode (as the negative electrode). Moreover, there is an organic light emitting diode device containing three organic layers, which are arranged in an order of a hole transport layer, organic emissive layer, electron transport layer. These three layers are placed between the transparent positive electrode and the negative metal electrode. The light emitting process is activated by applying a forward bias across the electrodes, wherein, under the drive of the electric field, the hole and electron inject respectively from the positive and negative electrodes after overcoming their energy barrier, and then meet in the organic emissive layer to form an exciton. The exciton then decays from the excited state to the ground state by emitting al photon.

The PPV (poly(arylene vinylene)) due to its excellent electroluminescent property was widely used in the fabrication of light emitting diodes. However, this kind of conjugated polymer is not soluble in solvents and can not be molten by heating, therefore, the Wessling precursor route (U.S. Pat. No. 3,401,152 (1968); U.S. Pat. No. 3,706,677 (1972)) was used for its preparation. In the Wessling precursor route, an elimination reaction is carried out to form a fully conjugated polymer by coating the precursor and heating the resulting layer in vacuum. In order to simplify the fabrication of the devices, a long carbon chain like alkyl or alkoxy is introduced to the side chain of the poly(arylene vinylene). This can improve the polymer solubility (Polym. Preprint, 1 (1990) 505; U.S. Pat. No. 5,408,109 (1995); U.S. Pat. No. 5,679,757 (1997)), allowing it to be soluble in common organic solvents, and at the same time changing its energy gap. Beside that a block co-polymer containing a rigid segment and a flexible segment was first co-polymerized by Karasz (Macromolecules, 26 (1993) 1180; Macromolecules, 26 (1993) 6570) using the Wittig reaction, in which the rigid segment is arylene vinylene and the flexible segment may be alkyl, ether or ester. By controlling the length of the rigid segment one can alter the color of the emissive light. The flexible segment not only can block the conjugation, but also enhance the solubility and film-forming ability of the co-polymers Currently, the emissive colors of polymeric light emitting diodes (PLED) include blue, green and even infra-red light. The color of light of PLED can be determined by the selection of one single electroluminescent polymeric material (Syn. Met., 71 (1995) 2175; Syn. Met., 71 (1995) 2117; U.S. Pat. No. 5,514,878 (1996)), or by the processing condition of the same electroluminescent polymeric material (Nature, 356 (1992) 47). Blending of two or more electroluminescent polymeric materials can also be used to yield various colors of PLED including the white light (Jpn. J. Appl. Phys., 32 (1993) L921; J. Appl. Phys., 76 (1994) 2419; Nature, 372 (1994) 444).

The common conjugated conducting polymers are p-type materials which can be oxidized easily, hence their transporting rate of hole is faster than that of electron transporting rate. Consequently, these two injected charges can not reach equilibrium, and thus the EL efficiency of the PLED is low.

In order to enhance the EL efficiency of the organic light emitting diode device, an additional electron transport layer (ETL) can be added to obtain a multilayer diode device with an improved quantum efficiency. This electron transport layer can be of (11) a thin film of electron transport material having a small heterocyclic molecule (like 2-(4-biphenylyl)-5-(4-tert-butylhenyl)-1,3,4-oxadiazole, PBD) evaporated onto the light emissive layer (Adv. Mater., 12 (1996) 979; Adv. Mater., 9 (1997) 127); (2) a thin layer formed on the light emissive layer by coating a solution of a blend of the small molecular electron transport material and an inert polymer such as poly(methyl methacrylate) (PMMA) (Appl. Phys. Lett., 61 (1992) 2793; J. Electron. Mater., 7 (1993) 745); (3) a thin layer formed on the light emissive layer by coating a solution of a traditional polymer such as poly (methacrylate) (PMA) having a side chain of a high electronegative heterocyclic moiety (Science, 267 (1 995) 1969); and (4) a thin layer formed on the light emissive layer by coating a solution of a conjugated or non-conjugated polymer having a high electronegative heterocyclic moiety incorporated to the backbone the of (Appl. Phys. Lett., 69 (1996) 881; Adv. Mater., 7 (19 95) 830; Chem. Mater., 7 (1995) 1568; Appl Phys. Lett., (1996) 2346).

Other than the multilayer structure described above, the blends of emissive materials and charge transport materials as a single active layer have also been developed to achieve the goal of improving the performance. There were 1) a direct blend of an electron transport material of a small organic molecule containing a high electronegative heterocyclic moiety and the emissive material (J. Electron. Mater., 5 (1994) 453; Macromolecules, 28 (1995) 1966; Jpn. J. Appl. Phys., 34 (1995) L1237); (2) a traditional polymer grafted with side chains of a high electronegative heterocyclic moiety and an emissive moiety (Macromolecules, 30 (1997) 3553), Syn. Met., 84 (1997) 437; Adv. Mater., 7 (1995) 898); and (3) a conjugated or non-conjugated polymer having a high electronegative heterocyclic moiety incorporated to the backbone thereof (Adv. Mater., 9 (1997) 1174; Polym. Preprint, 39 (1997) 103).

Although the above single and multilayer structures can improve the performance of the light emitting diode devies, they also have the following disadvantages. (1) When the electron transport material of the small organic molecules is evaporated on the emissive layer or is coated thereof after being blended into a polymer matrix, recrystallization and phase separation occur for these small molecules. Especially the joule heat occurred during the operation of the device will accelerate the recrystallization, and thus reduces the device stability. (2) For the multilayer structure having an electron transport layer made of a polymer containing a high electronegative heterocyclic moiety, not only the production process is cumbersome, but the operating voltage of the device will also increase greatly. (3) When the traditional polymer grafted with side chains of a high electronegative heterocyclic moiety and an emissive moiety is used,the resultant polyester possesses a larger energy gap. The device so fabricated will also have a higher operating voltage and is less stable. (4) For the conjugated polymer having a high electronegative heterocyclic moiety incorporated to the backbone thereof, the emissive light color may vary if that the conjugation is blocked by the electronegative heterocyclic moiety due to its strong electronegative property. As a result the emissive color is not easy to be predicted. Moreover, the property of the polymer may also change from a material possessing the original hole transport characteristic (prior to the electronegative heterocyclic moiety being incorporated) to a material having an undesired characteristic of electron conducting/hole blocking (ECHB).

In order to avoid these problems, the high electronegative heterocyclic moiety can be incorporated into a highly electroluminescent poly(arylene vinylene)polymer as a side incorporation of this moiety as a side chain, where the heterocyclic moiety is separated by a divalent group from the main chain, will not alter the emissive light color of the backbone. The resulting device will achieve the balance of the hole and electron injected, and significantly improve its efficiency. Also, the operating voltage of this device is not high. This technique was first reported by the inventors of the present application, "Poly(p-phenylene vinylene)s Modified with 2,5-Diphenyl-1,3,4-oxadiazole Moieties as EML Materials", International Conference on Organic Electroluminescent Materials, Sep. 14–17, 1996, Rochester, New York, USA.

In the year 1998, Z. Bao et. al. (Chem. Mater., 10 (1998) 1201) used the Heck reaction to synthesize a PPV modified with an oxadiazole side chain.

DETAILED DESCRIPTION OF THE INVENTION

Figure 1:
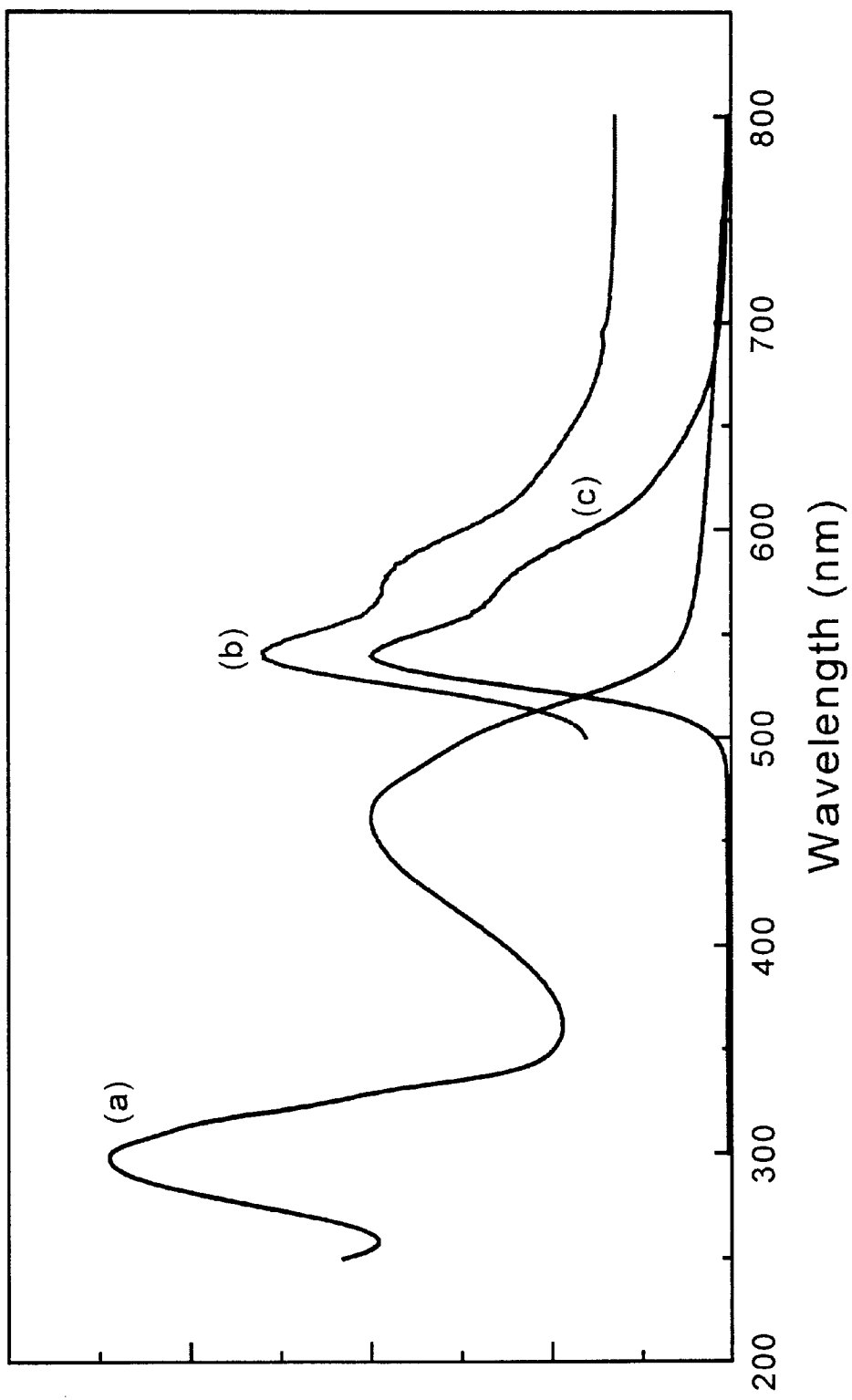
FIG. 1. The (a) UV-Vis, (b) photoluminescent (c) electroluminescent spectra of POPE-PPV conjugated polymer of this invention.

In this invention we synthesize electroluminescent conjugated polymers modified with high electronegative heterocyclic groups such as 1,3,4-oxadiazole-diyl, 1,3,4-thiadiayzole-diyl, and 1,2,4-triazole-diyl. These electroluminescent polymers (homopolymers or statistical copolymers) are obtained by polymerization of bis (halomethyl) aromatic monomer modified with a heterocyclic group via the Wessling precursor route, Gilch side chain route [J. Polym. Sci. Part A: Polym. Chem. 4 (1996) 1337: J. Prakt. them. 139: 611 (199); J. Am. Chem. Soc. 120, 231 (1998)]. In the former reaction route, the precursor obtained is soluble in a polar solvent such as water and methanol so that a thin film can be formed by casting followed by an elimination reaction to yield a high molecular weight electroluminescent polymeric film. In the Gilch side chain route, the resulting is soluble in a common organic solvent such as tetrahydrofuran and chloroform, and thus a film can be cast directly from the solution. By a proper selection of monomer, the light emissive materials of red, green and blue colors can be synthesized. In addition, the present invention also provides a lock or alternating copolymer synthesized by Wittig reaction or Wittig-Hornor reaction [Chem. Rev. 81 (1981) 415; Synth. Met. 91 (1997) 305]. By a proper selection of the monomers and their ratios in the polymerization, the emissive copolymer (fully conjugated or limited conjugating length) can be synthesized. The film formed of the electroluminescent polymer or copolymer of the present invention can be used as a light emissive layer in the single layer polymeric light emitting diode. Optionally, an additional hole transport layer can be inserted in this diode to reduce the starting voltage thereof. Alternatively, the thin film formed of the electroluminescent polymer or copolymer of the present invention can be used as an electron transport in the multi-layer polymeric light emitting diode to enhance the efficiency thereof.

The electroluminescent conjugated poly(arylene vinylene)polymers including homopolymers and copolymers, obtained from a bis(halomethyl) aromatic monomer modified with a high electronegative heterocyclic group, comprises an unit selected from owing formulas (I) and (III).

The electroluminescent conjugated poly(arylene vinylene)polymer synthesized via the Wessling precursor route, Gilch side chain route or Wittig-Horner route have an unit represented by the formula (I) (molecular weight between 1,000~2,000,000):

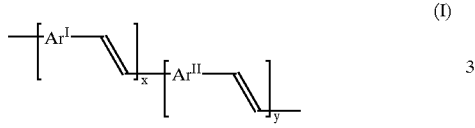
(I)

in which $0<x\leq 1$, $0\leq y<1$; $Ar^I$ is a divalent aromatic group (including heterocyclic aromatic group) which is selected from the group consisting of benzene, naphthalene, anthracene, fluorene, thiophene, furan, pyridine, 2,5-di-aryl-1,3,4-oxadiazole-diyl, 2,5-di-aryl-1,3,4-thiadiazole-diyl, 3,5-di-aryl-4-alkoxyaryl-1,2,4-triazole-diyl and a combination of each other, and at least one substituent of $Ar^I$ comprises a heterocyclic moiety of oxidiazole, thiadiazole or triazole, preferably having a structure (II) shown by the following formulas:

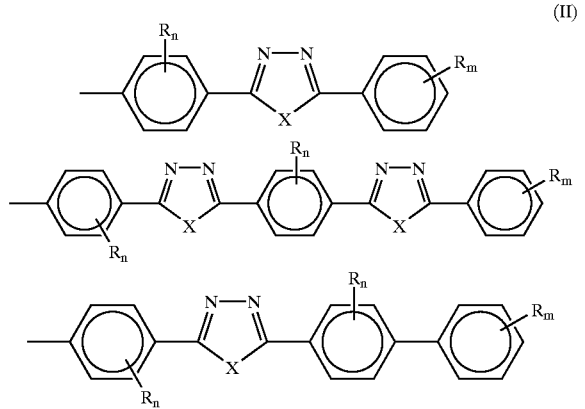
(II)

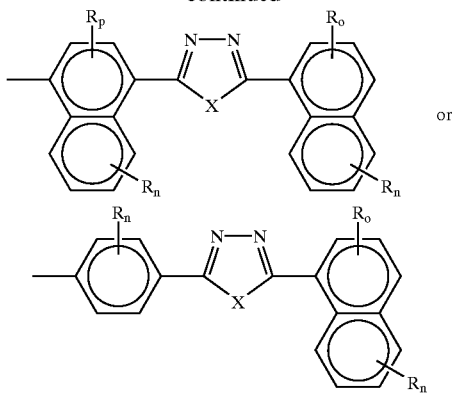
or in which m=1~5, n=1~4, o=1~3, p=1~2; R is a soluble group such as alkyl ($C_1$~$C_{22}$) or alkoxy ($C_1$~$C_{22}$), substituents on the same cyclic ring structure can be identical or different with any selected ratios between the different substituents; X=O, S, or N—$R^I$, wherein $R^I$ is selected from the group consisting of alkyl ($C_1$~$C_{22}$), alkoxy ($C_1$~$C_{22}$), phenyl, alkyl phenyl ($C_7$~$C_{28}$), alkoxy phenyl ($C_7$~$C_{28}$), phenoxy, alkyl phenoxy ($C_7$~$C_{28}$), alkoxy phenoxy ($C_7$~$C_{28}$), biphenyl, biphenylyloxy, alkyl biphenyl($C_{13}$~$C_{34}$), alkoxy biphenyl ($C_{13}$~$C_{34}$), alkyl biphenylyloxy ($C_{13}$~$C_{34}$) and alkoxy biphenylyloxy ($C_{13}$~$C_{34}$).

Preferably, the structure (II) of the heterocyclic group of the substituent has the following formula:

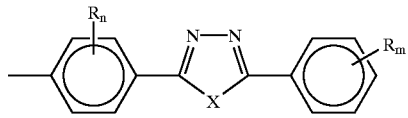

and more preferably, R is hydrogen and X is oxygen.

The heterocyclic group of structure (II) and $Ar^I$ are connected by a divalent group selected from the group consisting of —O—, —S—, —$OR^{II}O$—, —$OR^{II}S$—, —$SR^{II}S$— or —$R^{II}$—, wherein $R^{II}$ is alkylene ($C_1$~$C_{20}$) or arylene($C_6$~$C_{20}$). Preferably, the heterocyclic group of structure (II) and $Ar^I$ are connected by —$OR^{II}O$—, and more preferably $R^{II}$ is alkylene ($C_1$~$C_{20}$).

Other possible substituents for $Ar^I$ are hydrogen, alkyl ($C_1$~$C_{20}$), alkoxy ($C_1$~$C_{22}$), phenyl, phenoxy, halo (—Cl, —Br, —F), perfluoromethyl (—$CF_3$), cyano (—CN), silane, siloxane, or a combination of each other.

$Ar^{II}$ is a divalent aromatic group (including heterocyclic aromatic group) which is selected from the group consisting of benzene, naphthalene, anthracene, thiophene, furan, pyridine, 2,5-di-aryl-1,3,4-oxadiazole-diyl, 2,5-di-aryl-1,3,4-thiadiazole-diyl, 3,5-di-aryl-4-alkoxyaryl-1,2,4-triazole-diyl and a combination of each other. The possible soluble substituents of $Ar^{II}$ can be hydrogen, alkyl ($C_1$~$C_{20}$), alkoxy ($C_1$~$C_{22}$), phenyl, phenoxy, halo (—Cl, —Br, —F), perluoromethyl (—$CF_3$), cyano (—CN), silane, or siloxane, or a combination of each other.

When y in the conjugated polymer (I) is zero and the heterocyclic group of structure (II) and $Ar^I$ are connected by —$OR^{II}O$—, $R^{II}$ is alkylene ($C_{10}$~$C_{20}$) or arylene ($C_6$~$C_{20}$).

Preferably, y in the conjugated polymer (I) is greater zero, and more preferably $0.2 \leq y \leq 0.6$.

Preferably, $Ar^I$ and $Ar^{II}$ in the conjugated polymer (I) are phenylene having a substituent other than hydrogen, and more preferably $Ar^I$ contains only one substituent which is not hydrogen and $Ar^{II}$ contains two substituents which are not hydrogen, wherein one of the two substituents is methoxy (—OCH$_3$) and the other substituent being 2-ethyl hexoxy (—OCH$_2$CH(C$_2$H$_5$)C$_4$H$_9$).

The product obtained from Wittig reaction or Wittig-Hornor reaction is a block copolymer has an unit represented by the following formula (III) (molecular weight between 1,000 to 1,000,000):

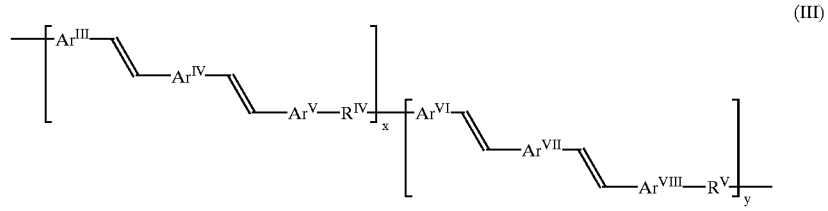

(III)

in which $0 \leq x \leq 1$, $0 \leq y \leq 1$; $Ar^{III}$, $Ar^{IV}$, $Ar^V$, $Ar^{VI}$, $Ar^{VII}$ and $Ar^{VIII}$ are aromatic groups (including the group comprising heterocyclic moiety) selected from the group consisting of benzene, naphthalene, anthracene, thiophene, furan, pyridine, 2,5-di-aryl-1,3,4-oxadiazole-diyl, 2,5-di-aryl-1,3,4-thiadiazole-diyl and 3,5-di-aryl-4-alkoxyaryl-1,2,4-triazole-diyl and could be identical or different with one another; wherein at least one substituent of $Ar^{III}$, $Ar^{IV}$, $Ar^V$, $Ar^{VI}$, $Ar^{VII}$ and $Ar^{VIII}$ must comprises the heterocyclic moiety of oxidiazole, thiadiazole or triazole, preferably having the structure (II) which is connected to $Ar^{III}$, $Ar^{IV}$, $Ar^V$, $Ar^{VI}$, $Ar^{VII}$ and $Ar^{VIII}$ by a divalent group selected from —O—, —NH—, —S—, —OR$^{II}$O—, —OR$^{II}$S—, —SR$^{II}$S—, —OR$^{II}$— or —R$^{II}$—; wherein R$^{II}$ is alkylene (C$_1$~C$_{20}$), arylene (C$_6$~C$_{20}$) or a mixture thereof; and the other possible substituents for $Ar^{III}$, $Ar^{IV}$, $Ar^V$, $Ar^{VI}$, $Ar^{VII}$ and $Ar^{VIII}$ are hydrogen, alkyl (C$_1$~C$_{20}$), alkoxy (C$_1$~C$_{22}$), phenyl, phenoxy, halo (—Cl, —Br, —F), perfluoromethyl (—CF$_3$), cyano (—CN), silane, siloxane, or a combination of one another; R$^{IV}$ and R$^V$ are soluble divalent groups selected from —O—, —NH—, —CO$_2$R$^{VI}$O$_2$C—, —O$_2$CR$^{VI}$CO$_2$—, —S—, —OR$^{VI}$O—, —OR$^{VI}$S—, —SR$^{VI}$S—, —OR$^{VI}$— or —R$^{VI}$—, wherein R$^{VI}$—, is alkylene(C$_1$~C$_{20}$) or arylene (C$_6$~C$_{20}$) groups, or a mixture thereof. Preferably, R$^{IV}$ and R$^V$ are —OR$^{VI}$O—, and R$^{VI}$ is alkylene (C$_1$~C$_{20}$) group.

Preferably, the heterocyclic group of structure (II) and $Ar^{III}$, $Ar^{IV}$, $Ar^V$, $Ar^{VI}$, $Ar^{VII}$ and $Ar^{VIII}$ are connected by —OR$^{II}$O—, and more preferably R$^{II}$ is alkylene (C$_1$~C$_{20}$).

Preferably, the heterocyclic group of structure (II) has the following formula:

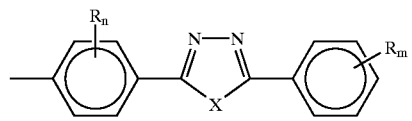

and more preferably, R is hydrogen and X is oxygen.

Preferably, $Ar^{III}$ and $Ar^{VI}$ are identical, and $Ar^V$ and $Ar^{VIII}$ are identical, $R^{IV}$ and $R^V$ are identical.

Preferably, y in the conjugated copolymer (III) is zero and at least one substituent of $Ar^{III}$, $Ar^{IV}$ and $Ar^V$ comprises the heterocyclic moiety of oxidiazole, thiadiazole or triazole, preferably having the structure (II), which is connected to $Ar^{III}$, $Ar^{IV}$, $Ar^{VI}$ by a divalent group selected from —O—, —NH—, —S—, —OR$^{II}$O—, —OR$^{II}$S—, —SR$^{II}$S—, —OR$^{II}$— or —R$^{II}$—. Preferably, $Ar^{III}$, $Ar^{IV}$ and $Ar^V$ in the conjugated polymer (III) are phenylene having a substituent other than hydrogen; and more preferably $Ar^{IV}$ contains only one substituent which is not hydrogen and contains the heterocyclic moiety of structure (II), and $Ar^{III}$ and $Ar^V$ contain one or two alkyloxy (C$_1$~C$_8$) substituents; and most preferably $Ar^{III}$ and $Ar^V$ contain two methoxy substituents.

One of the goals of this invention is to obtain a novel light emissive material in order to make the single layer light emitting diode device with high photoluminescence. The common conjugated polymers (except those polymers with nitrogen/oxygen heterocyclic backbones) are easily oxidative p-type materials, and their hold transport rate is faster than the electron transport rate. Therefore, the two injected charges can not achieve balance in the light emitting diode device made from these common conjugated polymers, which in turn lowers the efficiency thereof. In order to improve the efficiency without significant change of the color of emissive light from the main chain, a high electronegative, electron transport and hole blocking capacity heterocyclic moiety is introduced into a side chain of the backbone of the polymers according to the present invention. This moiety can increase the amount of injected electron, so that the balance between the two injected charges is achieved in the light emitting diode device made from the conjugated polymers of the present invention, hence the efficiency thereof is greatly enhanced.

The preparation methods of the high electronegative heterocyclic moiety modified polymers of the present invention are to first prepare a high electronegative heterocyclic moiety side chain modified bis(halomethyl) aromatic (including heterocyclic aromatic) monomer, and then obtain a homopolymer or a copolymer via the Wessling precursor route or Gilch side chain route; or obtain a block copolymer or a statistical Copolymer directly via the Wittig reaction or Wittig-Hornor reaction. The preparation methods of the present invention can obtain products having structures different those polymerized via the Heck coupling polymerization (Chem. Mater., 10 (1998) 1202). Also, the preparation methods of the present invention are different from the traditional method for preparing a conjugated light emissive material from heat resistant poly(diazole) and poly(triazole) via a precursor ring cyclization route (Adv. Mater., 7 (1995) 559; Chem. Mater., 7 (1995) 1568). The side chain modified bis(halomethyl) aromatic monomer prepared in the present invention provides more convenience and modification possibilities in the syntheses of the conjugated polymers and copolymers, and in particular provides greater freedom in the syntheses of copolymers. By selecting different monomers we can yield light emissive polymers covering the full range of visible lights.

As recorded in the scientific and technical papers, there are great deviations in the efficiency and maximum brightness data of PLED done by various laboratories. This is mainly due to the differences in the laboratory conditions and the equipment used during the making of the devices. In the following embodiment examples, the devices were prepared under the conditions of: evaporation was carried out at vacuum pressure of approximately $10^{-5}$ Torr; elimination reaction was carried out at vacuum pressure of 100 mTorr; and the other processes such as coating, encapsulation, and etc. were performed under atmosphere. The measurements were done under vacuum pressure of 300 mTorr. Although the conditions described as above are not perfect, the properties of the devices made in the following embodiment examples reveal the advancement of the novel materials this invention.

The present invention, "Electroluminescent conjugated polymers modified with high electronegative heterocyclic moieties and their applications in polymeric light emitting diodes", will be described in greater details in the following examples accompanied with the drawings.

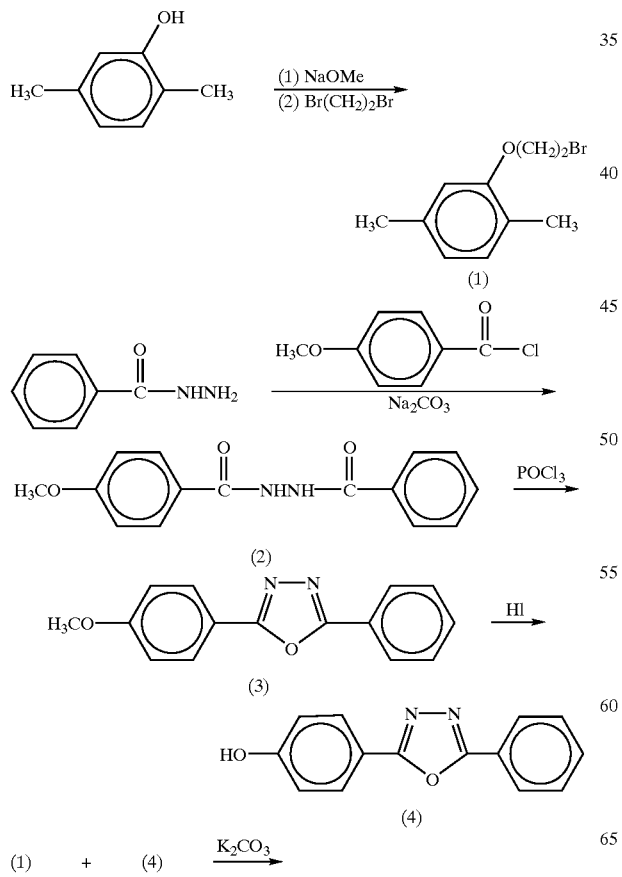

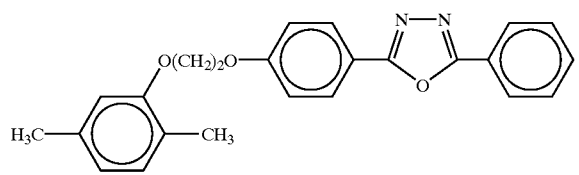

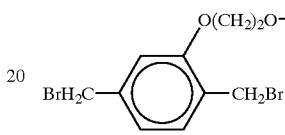

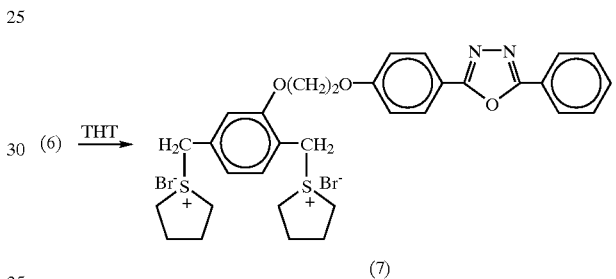

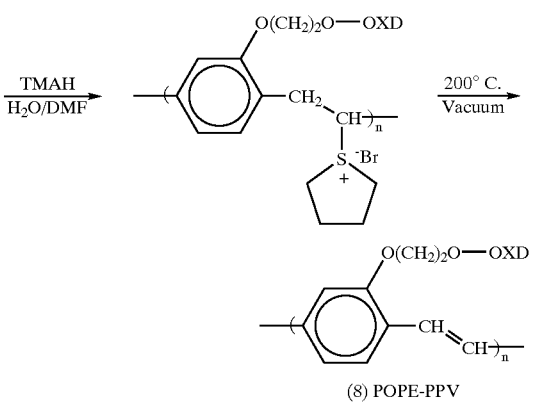

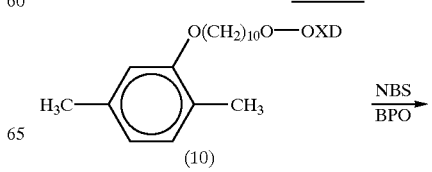

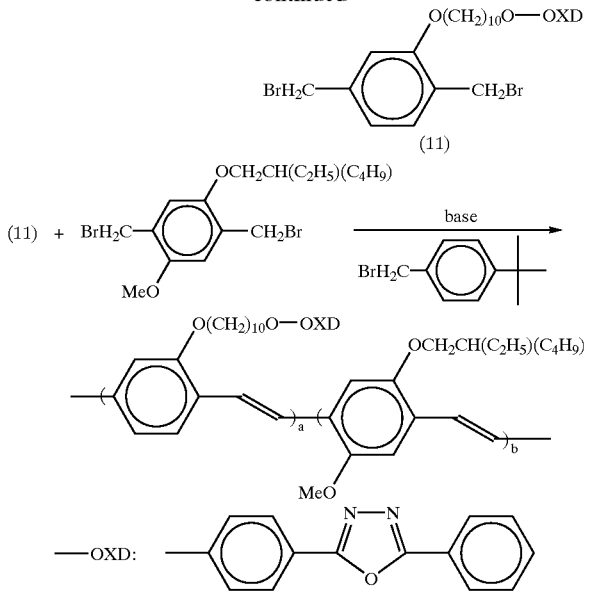

(9): a = 0, b = 1 (MEH-PPV)
(12): a = 1, b = 0 (POPD-PPV)
(13): a = 0.8, b = 0.2 (POPD-MEH-PPV (80/20))

EXAMPLE 1

The preparation of poly[2-(2'-(p-(5"-phenyl-1",3",4"-oxadiazole-2"-yl) phenoxy)ethanoxy)phenylene vinylene] (POPE-PPV) and fabrication of a LED device containing the same 1. Syntheses (Shown in Scheme 1 and 2)

Preparation of 1-(2'-Bromoethanoxy) 2,5-Dimethylbenzene (1)

A solution of 75.2 g (0.4 mol) 1,2-dibromoethane in 80 mL of anhydrous ethanol was stirred and heated to 65° C. under a nitrogen atmosphere, and then a solution of 24.4 g (0.2 mol) of 2,5-dimethylphenol and 10.8 g (0.2 mol) of NaOMe in anhydrous ethanol (100 mL) was added into the above solution dropwise. After finish adding, refluxed for 5 hours. The mixture was cooled to room temperature, washed and extract d with ethyl ether, 2M NaOH solution and deionized water. The organic phase was collected, dried with $CaCl_2$ and then filtered. After evaporating the solvent from the filtrate, 1-(2'-bromoethanoxy) 2,5-dimethylbenzene was purified by vacuum distillation. $^1$H-NHR ($CDCl_3$, ppm): δ 7.00 (d, 1H), δ 6.4 (d, 1H), δ 6.6 (s, 1H), δ 4.24 (t, 2H), δ 3.62 (t, 2H), δ 2.3 (s, 3H), δ 2.2 (s, 3H).

Preparation of 1-(p-Anisoyl) 2-Benzoyl Hydrazide (2)

A solution of 7.98 g (58.6 mmol) benzoyl hydrazine and 6.22 g (58.6 mmol) $Na_2CO_3$ in dioxane was prepared under Scheme 4

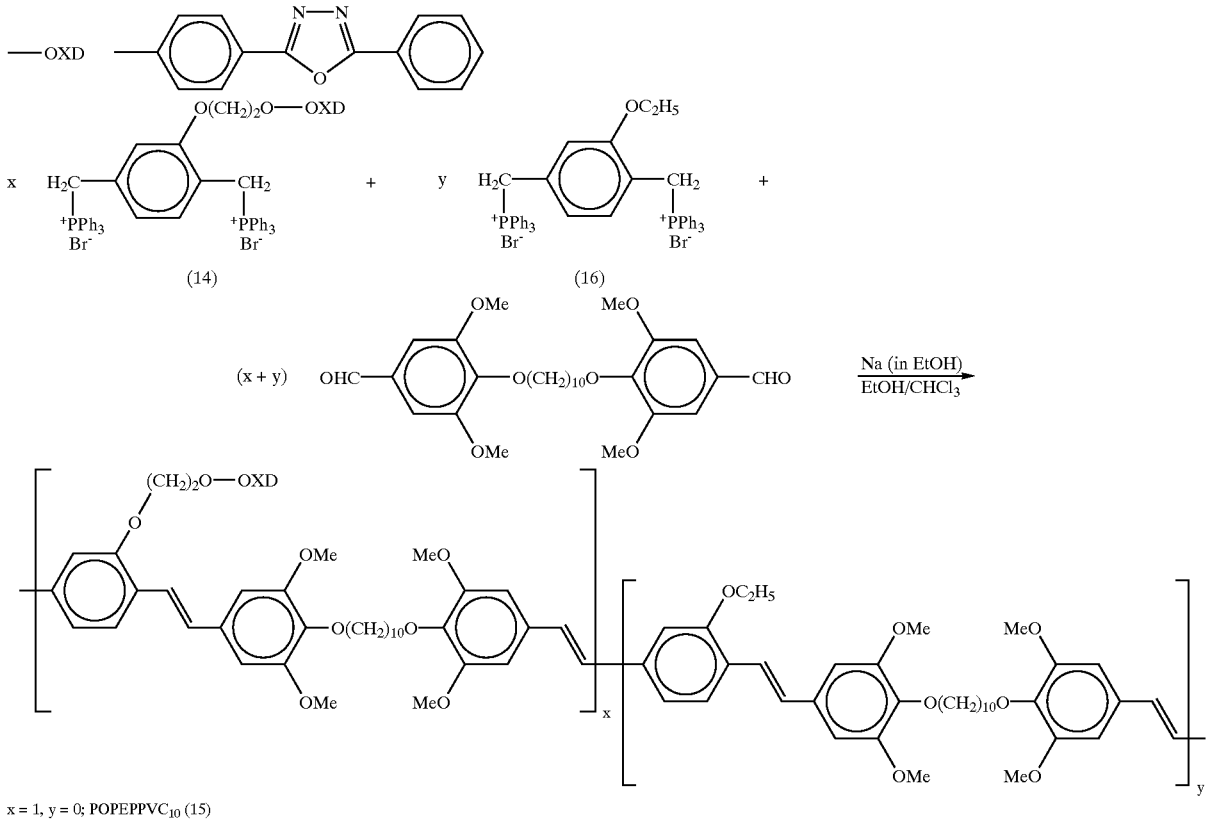

x = 1, y = 0; POPEPPVC$_{10}$ (15)
x = 0, y = 1; PEPVC$_{10}$ (17)

nitrogen. To the resulting solution, a solution of 10 g (58.6 mmol) of p-anisoyl chloride in 50 mL of dioxane was added dropwise. The mixture was allowed to react at room temperature for 24 hours. After filtering by suction and drying under vacuum, the solid was purified with 250 mL of ethyl ether to yield 1-(p-anisoyl) 2-benzoyl hydrazide. $^1$H-NMR (DMSO-d$_6$, ppm): δ 10.4 (s, 2H), δ 7.93 (m, 4H), δ 7.54 (m, 3H), δ 7.07 (d, 2H), δ 3.83 (s, 3H); mp 194.2° C.

Preparation of 2-(p-Anisoyl) 5-Phenyl 1,3,4-Oxadiazole (3)

13 g (48.1 mmol) 1-(p-anisoyl) 2-benzoyl hydrazide was added to 170 mL POCl$_3$ under nitrogen, and refluxed at 80° C. for 20 hours. The excessive POCl$_3$ in the reaction mixture was removed under vacuum, and the resulting mixture was precipitated by a large amount of deionized water. The precipitate was collected and dried under vacuum, and then the crude product was re crystallized with acetone to yield 2-(p-anisoyl) 5-phenyl 1,3,4-oxadiazole. $^1$H-NMR (DMSO-d$_6$, ppm): δ 8.1 (m, 4H), δ 7.65 (m, 3H), δ 7.21 (d, 2H), δ 3.88 (s, 3H); mp 151.8° C.

Preparation of p-(5-Phenyl-1,3,4-oxadiazole-2-yl)phenol (4)

3.5 g (13.89 mmol) of 2-(p-anisoyl) 5-phenyl 1,3,4-oxadiazole and 100 mL of concentrated HI aqueous solution was mixed under nitrogen and refluxed at 130° C. for 12 hours. The mixture was cooled down to room temperature and 100 mL of deionized water was added. The precipitate was collected by filtration and dried under vacuum, p-(5-phenyl-1,3,4-oxadiazole-2-yl)phenol was obtained. $^1$H-NMR (acetone-d$_6$, ppm): δ 9.26 (s, 1H), δ 8.15 (m, 2H), δ 8.06 (d, 2H), δ 7.62 (m, 3H), δ 7.07 (d, 2H); mp 256.5° C.

Preparation of 2-(2'-(p-(5"-Phenyl-1",3",4"-oxadiazole-2"-yl)phenoxy)ethanoxy) 1,4-Dimethyl-benzene (5)

6.43 g (27 mmol) of p-(5-phenyl-1,3,4-oxadiazole-2-yl) phenol, 6.97 g (30 mmol) of 1-(2'-bromoethanoxy) 2,5-dimethylbenzene and 6 g (43.5 mmol) of K$_2$CO$_3$ were added to 80 mL of dried N,N-dimethyl foramide under nitrogen and refluxed at 80° C. for 68 hours. The mixture was cooled to room temperature, filtered and concentrated. The concentrated solution was added to water, and precipitate was formed. The precipitate was collected by filtration, and then dried under vacuum. After re-crystallized in ethanol, 2-(2'-(p-(5"-phenyl-1",3",4"-oxadiazole-2"-yl)phenoxy) ethanoxy) 1,4-dimethyl-benzene was obtained. $^1$H-NMR (CDCl$_3$, ppm): δ 8.13 (m, 2H), δ 8.08 (d, 2H), δ 7.54 (m, 3H), δ 7.08 (d, 2H), δ 7.02 (d, 1H), δ 6.72 (d, 1H), δ 6.7 (s, 1H), δ 4.43 (t, 2H), δ 4.35 (t, 2H), δ 2.33 (s, 3H), δ 2.18 (s, 3H); mp 127.66° C.

Preparation of 2-(2'-(p-(5"-Phenyl-1",3",4"-oxadiazole-2"-yl)phenoxy)-ethanoxy) 1,4-bis(Bromomethyl)benzene (6)

1.9 g (10.67 mmol) of N-bromosuccinimide, 2 g (5.18 mmol) of 2-(2'-(p-(5"-phenyl-1",3",4"-oxadiazole-2"-yl) phenoxy)ethanoxy) 1,4-dimethyl-benzene and 0.05 g (0.207 mmol) of benzoyl peroxide were added to 100 mL of CCl$_4$ under nitrogen and refluxed at 80° C. for 4 hours. The reaction mixture was cooled down, filtered and concentrated by rotatory evaporator. The resulting solid was washed with methanol, collected and dried under vacuum again to yield 2-(2'-(p-(5"-Phenyl-1",3",4"-oxadiazole-2"-yl)phenoxy)-ethanoxy) 1,4-bis(bromomethyl)benzene. $^1$H-NMR (CDCl$_3$, ppm): δ 8.14 (m, 4H), δ 7.54 (m, 3H), δ 7.33 (d, 1H), δ 7.11 (d, 2H), δ 6.99 (m, 2H), δ 4.47 (m, 8H).

Preparation of 2-(2'-(p-(5"-Phenyl-1",3",4"-oxadiazole-2"-yl)phenoxy)ethanoxy) 1,4-bis(Tetrahydropheniomethyl) benzene Bromide (7)

2.63 g (4.83 mmol) of 2-(2'-(p-(5"-Phenyl-1",3",4"-oxadiazole-2"-yl)phenoxy)-ethanoxy) 1,4-bis (bromomethyl)benzene and 2.55 g (29 mmol) of tetrahydrothiophene were added to 100 mL of methanol under nitrogen and refluxed at 50° C. for 20 hours. The mixture was cooled to room temperature an concentrated. Cold acetone (about −5~−10° C.) was added to the concentrated mixture and a precipitate was formed. The precipitate was collected, and dried under vacuum, 2-(2'-(p-(5"-phenyl-1", 3",4"-oxadiazole-2"-yl)phenoxy)ethanoxy) 1,4-bis (tetrahydrophenio methyl)benzene bromide was obtained. $^1$H-NMR (10:1 D$_2$O/acetone-d6, ppm): δ 7.9 (m 4H), δ 7.5 (m, 4H), δ 7.18 (s, 1H), δ 7.12 (d, 1H), δ 7.01 (d, 2H), δ 4.45 (s, 2H), δ 4.36 (s (broad), 6H), δ 3.40 (m, 8H), δ 2.23 (m, 4H), δ 2.12 (m, 4H).

Preparation of Poly[2-(2'-(p-(5"-Phenyl-1",3",4"-oxadiazole-2"-yl)phenoxy)ethanoxy)phenylene Vinylene] (POPE-PPV) (8)

0.5 g (0.6944 mmol) of 2-(2'-(p-(5"-phenyl-1",3",4"-oxadiazole-2"-yl)phenoxy)ethanoxy) 1,4-bis (tetrahydropheniomethyl)benzene bromide was dissolved in 19 mL of a solvent mixture of dimethylformamide (DMF) :H$_2$O=1:1 (v/v) under nitrogen. To the resulting solution 0.750 mL of 10 wt % tetramethylammonium hydroxide was added at 0° C., and polymerized for 45 minutes. The reaction mixture was neutralized with 1M HCl solution to pH of 7, and then dialyzed with deionized water to obtain the polymer precursor (the dialyslis membrane having a cut off= 3500 dalton). The polymer precursor was coated on a quartz plate, and an elimination reaction was carried out at 200° C. under vacuum or inert atmosphere for 12 hours to obtain poly[2-(2'-(p-(5"-phenyl-1",3",4"-oxadiazole-2"-yl) phenoxy)ethanoxy)phenylene vinylene] (POPE-PPV).

2. The Fabrication of Device

Figure 2:
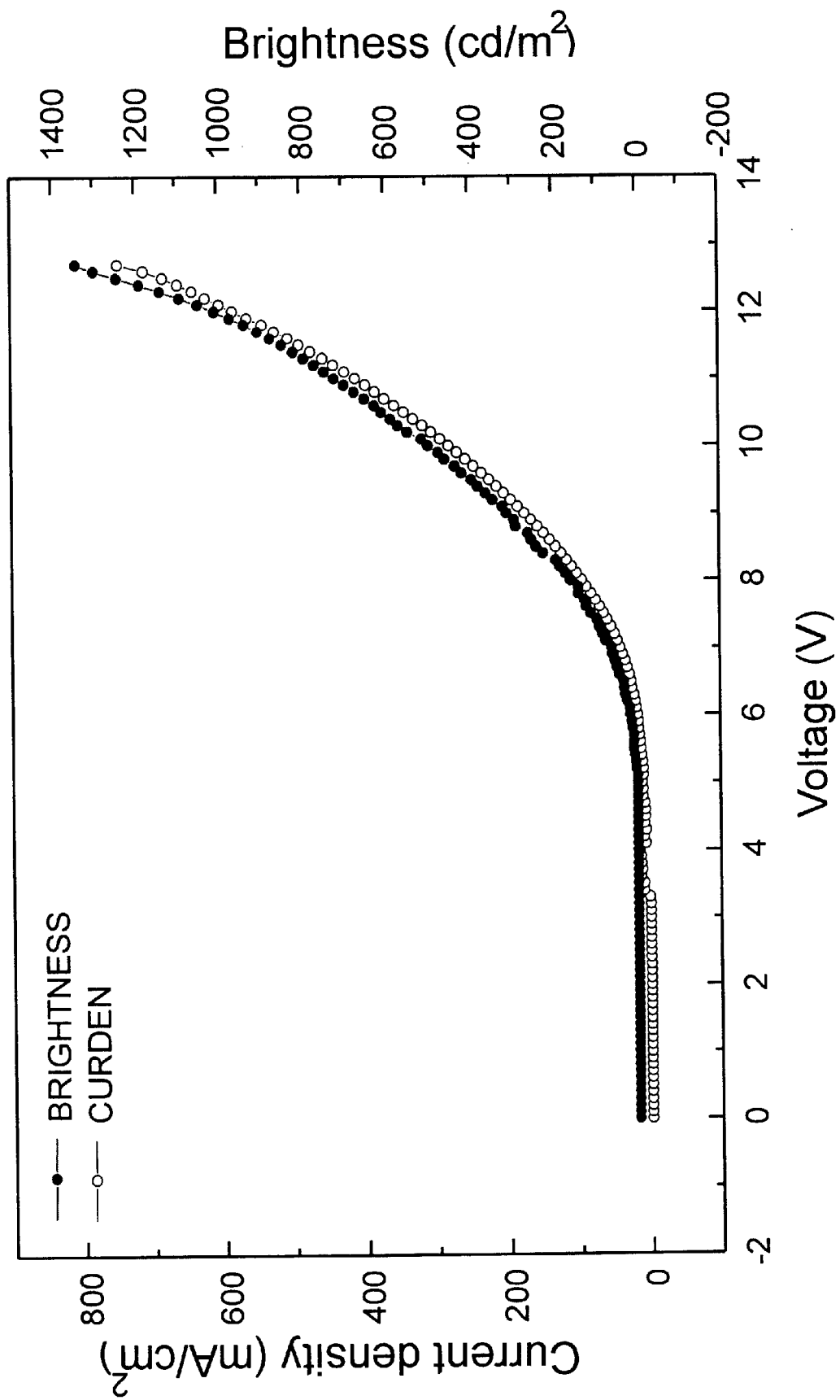
FIG. 2. The plot of current density and brightness vs. voltage of ITO/POPE-PPV/Ca/Ag polymeric light emitting diode (PLED) of this invention.

A POPE-PPV precursor in DMF was spin coated on an ITO/glass substrate to form a film thereon, and an elimination reaction was carried out by heating to 200° C. at a vacuum pressure of about 100 mTorr to obtain a fully conjugated POPE-PPV film (polymer 8 in Scheme 2). The thickness of the resulting film was about 50 nm. A low work function Ca metal layer was deposited on the film under a vacuum pressure of about 10$^{-5}$ Torr. Afterwards, a protective layer of silver was deposited thereon to avoid oxidation of Ca metal. The deposited area was about 3.26 mm$^2$. A yellow light was emitted when a forward bias of about 2.5 V was applied. FIG. 1 shows the UV-Vis spectrum (a), photoluminescent spectrum (b) and electrolumine scent spectrum (c). FIG. 2 shows the relationship between current density, voltage and brightness. The maximum external quantum efficiency of this device is 0.11% and the maximum brightness is over 1000 cd/m$^2$. In comparison with he MEH-PPV in Control Example 2, the introduction of oxadiazole to the side chain can enhance the maximum external quantum efficiency, which is about 37.5% increase.

EXAMPLE 2 (Control)

The Preparation of Poly[2-methoxy 5-(2'-Ethyl Hexyloxy) phenylene Vinylene] and Fabrication of a LED Device Containing the Same 1. Synthesis (Shown in Scheme 3; Synthesis of the Monomers Refers to the Procedures Described in U.S. Pat. No. 5,408,109 (1995))

Preparation of Poly[2-methoxy 5-(2'-Ethyl Hexyloxy) phenylene Vinylene] (MEH-PPV) (9)

0.409 g (0.97 mmol) of 2-methoxy 5-(2'-ethyl hexyloxy) 1,4-bis(bromomethyl)benzene and 0.22 g (0.97 mmol) of t-butyl-benzylic bromide were dissolved in 50 mL anhydrous THF under nitrogen. To the resulting solution a solution of 0.426 g (3.8 mmol) of potassium t-butoxide in 50 mL anhydrous THF was rapid added at room temperature while stirring, The mixed solution became orange color immediately following the addition. After reacting 9 hours at room temperature, methanol was added to form polymer precipitate. The precipitate was thoroughly washed with methanol and deionized water. After dried under vacuum overnight, the red precipitate was further purified by dissolving in chloroform and precipitating by addition of methanol. The dried collected precipitate of 0.12 g (48% yield) of the title product was obtained.

2. The Fabrication of Device

Figure 3:
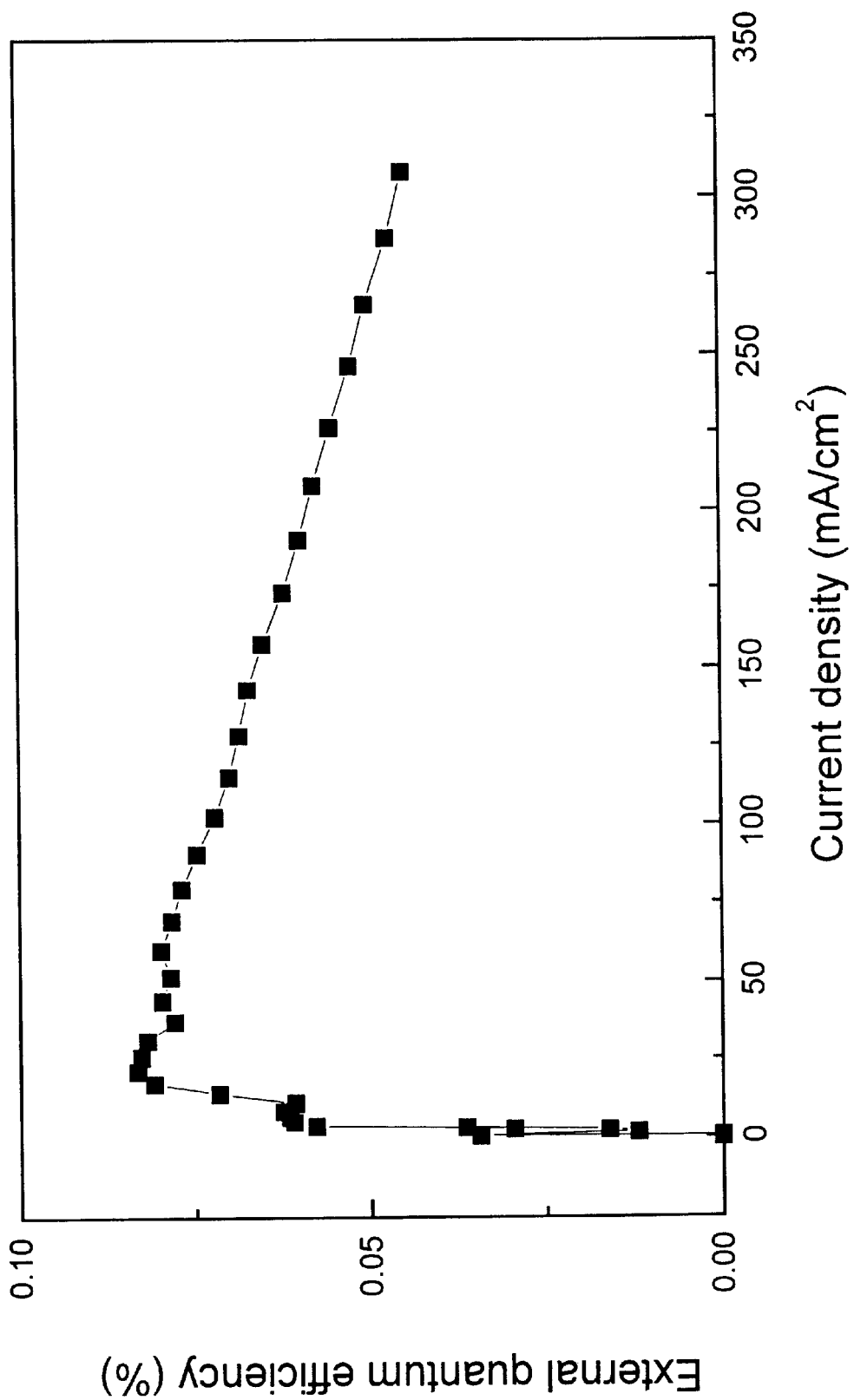
FIG. 3. The plot of external quantum efficiency vs. current density of the ITO/MEH-PPV/Ca/AI PLED of the prior art.

A film of MEH-PPV (polymer 9 in Scheme 3) was formed on an ITO/glass substrate by spin coating from its solution of 5 mg/mL in chloroform. The thickness of the resulting film was about 40 nm. A low work function Ca metal layer was deposited on the film under a vacuum pressure, of about $10^{-5}$ Torr. Afterwards, a layer of Al was deposited thereon as a Protective layer. The deposited area was about 11 mm$^2$. An orange light was emitted when a forward bias of about 3 V was applied. FIG. 3 shows the relationship between external quantum efficiency and current density of this device. The maximum external quantum efficiency of this device is 0.08% and the maximum brightness is about 700 cd/m$^2$.

EXAMPLE 3
The Preparation of Poly[2-(10'-(p-(5"-Phenyl-1",3",4"-oxadiazole-2"-yl)phenoxy)decanoxy)phenylene Vinylene] and Fabrication of a LED Device Containing the Same 1. Synthesis (Shown in Scheme 3; the Synthesis of the Starting Material (10) is Similar to the Compound (5) in Example 1)

Preparation of 1-(10'-Bromodecanoxy) 2,5-Dimethylbenzene (1')

The synthesis procedures of the compound (1) in Example 1 were repeated except that 1,2-dibromomethane was replaced by 1,10-dibromodecane.

Preparation of 2-(10'-(p-(5"-Phenyl-1",3",4"-oxadiazole-2"-yl)phenoxy)-decanoxy) 1,4-Dimethyl-benzene (10)

8 g (33.6 mmol) of p-(5-phenyl-1,3,4-oxadiazole-2-yl) phenol, 12.73 g (37.3 mmol) of 1-(10'-bromodecanoxy) 2,5-dimethylbenzene and 7.42 g (53.8 mmol) of K$_2$CO$_3$ were added to 110 mL dried N,N-dimethyl foramide under nitrogen, and refluxed at 80° C. for 30 hours. The mixture was cooled down to room temperature, filtered and concentrated before water was added for precipitation. The precipitate was collected, dried under vacuum and then re-crystallized with ethanol to yield 2-(10'-(p-(5"-phenyl-1", 3",4"-oxadiazole-2"-yl)phenoxy)-decanoxy) 1,4-dimethyl-benzene. $^1$H-NMR (CDCl$_3$, ppm): δ 8.15 (m, 2H), δ 8.08 (d, 2H), δ 7.54 (m, 3H), δ 7.04 (d, 2H), δ 7.00 (d, 1H), δ 6.68 (d, 1H) δ 6.63 (s, 1H), δ 4.03 (t, 2H), δ 3.94 (t, 2H), δ 2.3 (s, 3H), δ 2.18 (s, 3H), δ 1.8 (m, 4H), δ 1.48 (m, 4H), δ 1.35 (s, 8H); mp 91° C.

Preparation of 2-(10'-(p-(5"-Phenyl-1",3",4"-oxadiazole-2"-yl)phenoxy)decanoxy) 1,4-bis(Bromomethyl)benzene (11)

1.43 g (8 mmol) of N-bromosuccinimide, 2 g (4 mmol) of 2-(10'-(p-(5"-Phenyl-1",3",4"-oxadiazole-2"-yl)phenoxy)-decanoxy) 1,4-dimethyl-benzene, and 0.04 g (0.14 mmol) of benzoyl peroxide were added to 80 mL of CCl$_4$ under nitrogen, and refluxed at 80° C. for 3 hours. The mixture was cooled down, filtered and concentrated by rotatory evaporator. The brown mixture was purified with chromatography to yield white color product. $^1$H-NMR (CDCl$_3$, ppm): δ 8.1 (q, 2H), δ 8.04 (d, 2H), δ 7.5 (m, 3H), δ 7.27 (d, 1H), δ 7.0 (d, 2H), δ 6.9 (d, 1H), δ 6.86 (s, 1H), δ 4.51 (s, 2H), δ 4.43 (s, 2H), δ 1.8 (m, 4H), δ 1.5 (m, 4H), δ 1.34 (s, 8H); mp. 102° C.

Preparation of Poly[2-(10'-(p-(5"-phenyl-1",3",4"-oxadiazole-2"-yl)phenoxy)decanoxy)phenylene Vinylene] (POPD-PPV) (12)

0.637 g (0.97 mmol) of 2-(10'-(p-(5"-phenyl-1",3",4"-oxadiazole-2"-yl)phenoxy)decanoxy) 1,4-bis(bromomethyl) benzene and 0.22 g (0.97 mmol) of t-butyl-benzylic bromide were dissolved in 50 mL THF under nitrogen. To the resulting solution a solution of 0.426 g (3.8 mmol) of potassium t-butoxide in 50 mL THF was added rapidly at room temperature while stirring. The color of the solution mixture became orange immediately. After reacting 9 hours at room temperature, methanol was added to form polymer precipitate. The precipitate was washed by methanol and deionized water. After dried under vacuum, the orange precipitate was purified by dissolving in chloroform and precipitating by addition of methanol. The dried collected precipitate of 0.29 g (yield of 60%) was obtained.

2. The Fabrication of Device

Figure 4:
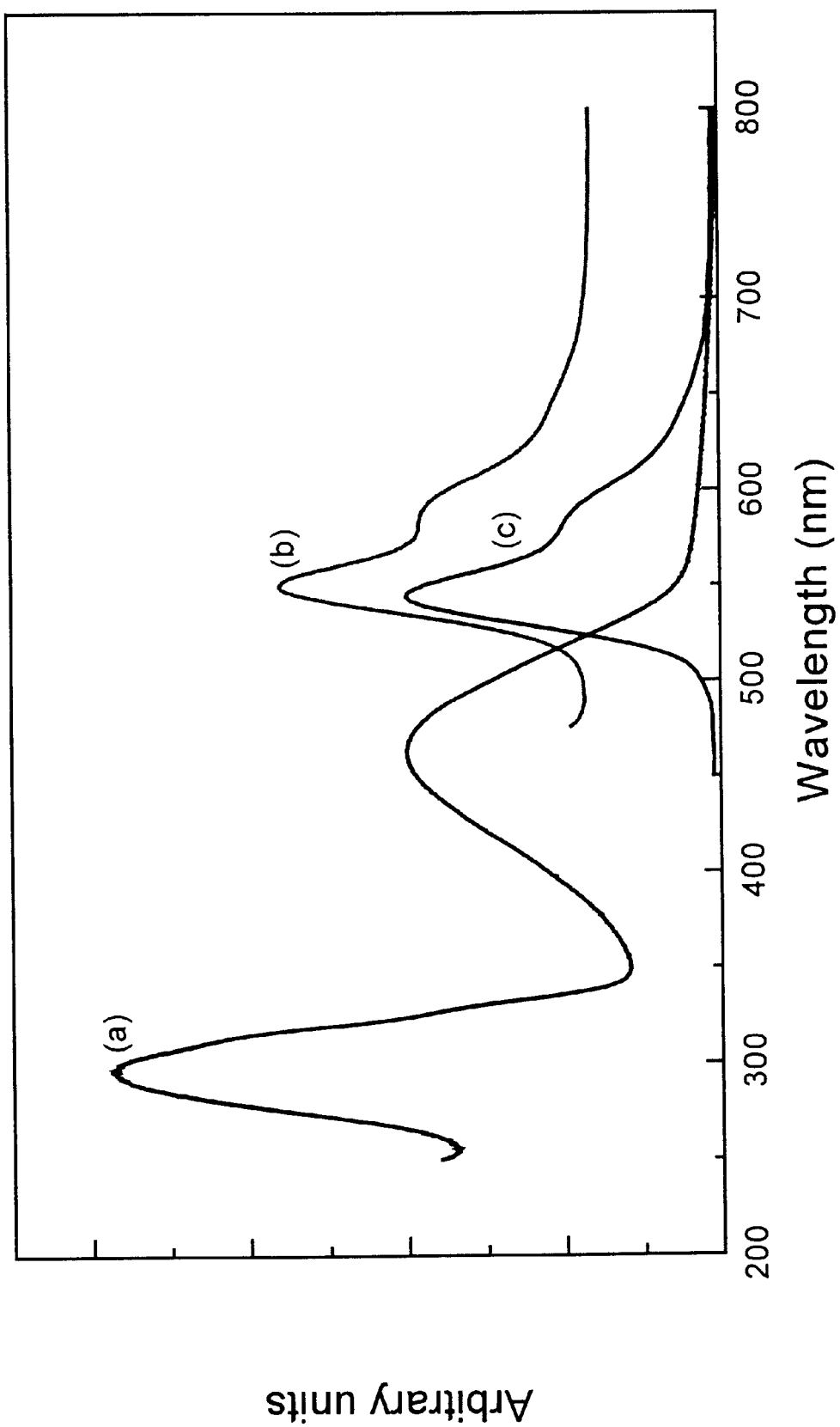
FIG. 4. The pilot of (a) UV-Vis, (b) photoluminescent (c) electroluminescent spectra of POPD-PPV conjugated polymer in this invention.
Figure 5:
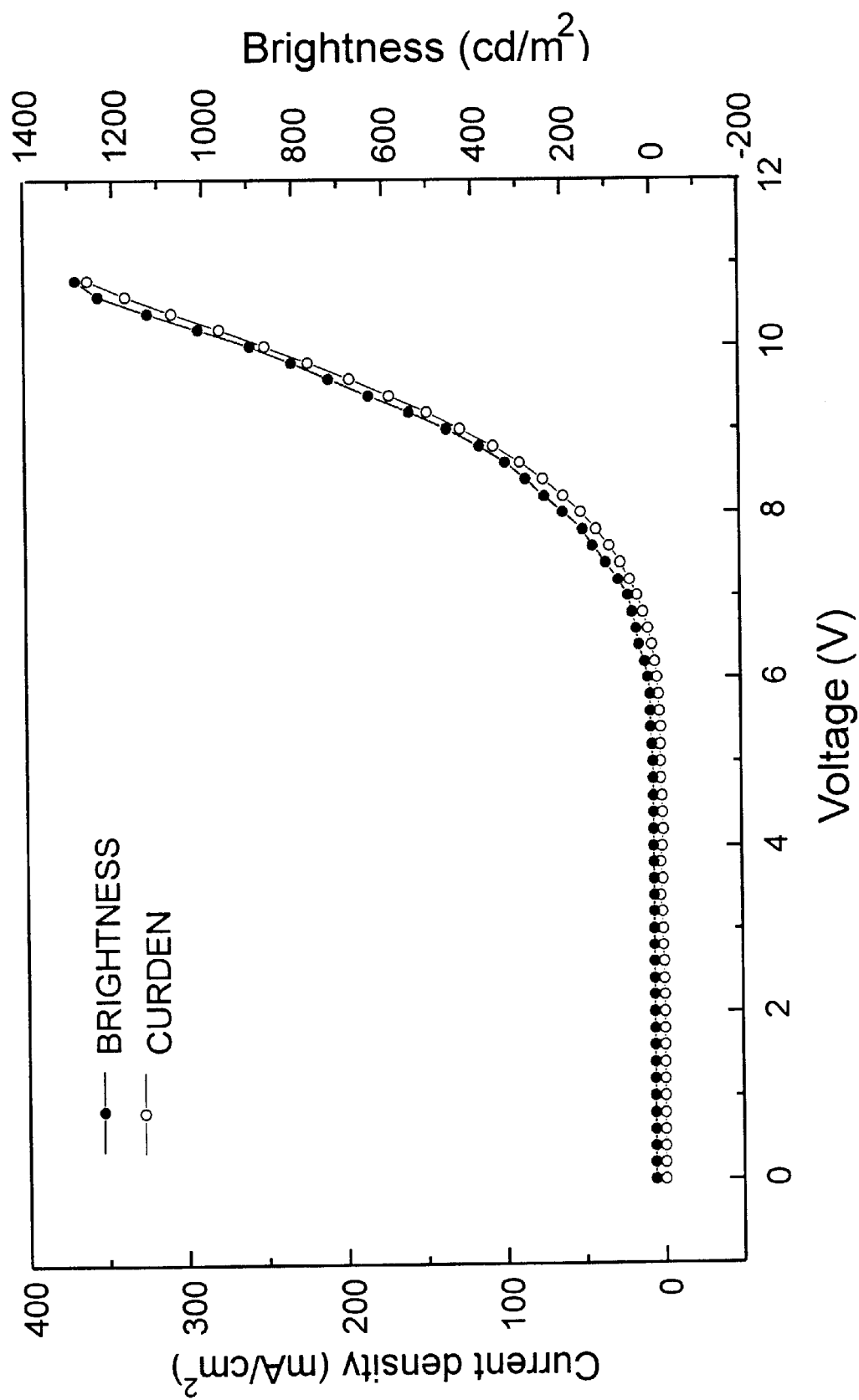
FIG. 5. The plot of current density and brightness vs. voltage of ITO/POPD-PPV/Ca/AI PLED of this invention.

A film of POPD-PPV (polymer 12 in Scheme 3) was formed on an ITO/glass substrate by spin coating from its solution of 5 mg/mL in chloroform. The thickness of the resulting film was about 35 nm. A low work function Ca metal layer was deposited on the film under a vacuum pressure of about $10^{-5}$ Torr. Afterwards, a layer of Al was deposited thereon as a protective layer. The deposited area was about 8 mm$^2$. A yellow light was emitted when a forward bias of about 2.5 V was applied. FIG. 4 shows the UV-Vis spectrum (a), photoluminescent spectrum (b) and electroluminescent spectrum (c). FIG. 5 shows the relationship between current density, voltage and brightness. The maximum external quantum efficiency of this device is 0.26% and the maximum brightness is over 1000 cd/m$^2$. In comparison with device fabricated in Example 1, it can be understood that the length of the spacer between the backbone and the side chain has an effect on the emissive efficiency. Moreover, the maximum external quantum efficiency of the device fabricated in this example is increased by a factor of 3.25 times compared to Control Example 2.

EXAMPLE 4
The Preparation of Poly[2-(10'-(p-(5"-phenyl-1",3",4"-oxadiazole-2"-yl)phenoxy)decanoxy)phenylene Vinylene-co-2-methoxy 5-(2'-Ethyl Hexyloxy)phenylene Vinylene] (POPD-MEH-PPV (80/20)) and Fabrication of a LED Device Containing the Same 1. Synthesis (Shown in Scheme 3)
Preparation of (POPD-MEH-PPV(80/20)) (13)

0.51 g (0.78 mmol) of 2-(10"-(p-(5"-phenyl-1",3",4"-oxadiazole-2"-yl)phenoxy)decanoxy) 1,4-bis(bromomethyl) benzene, 0.08 g (0.19 mmol) of 2,5-bis(bromomethyl)-1-methoxy-4-(2'-ethyl hexyloxy)benzene and 0.22 g (0.97 mmol) of t-butyl-benzylic bromide were dissolved in 50 mL of anhydrous THF under nitrogen. To the resulting solution a solution of 0.426 g (3.8 mmol) of potassium t-butoxide in 50 mL anhydrous THF was added rapidly at room temperature while stirring. The color of the solution mixture became orange immediately. After reacting 9 hours at room temperature, methanol was added to form polymer precipitate. The precipitate was washed with methanol and deionized water. The precipitate was purified again by dissolving in chloroform and then precipitating by methanol. The orange-red precipitate of 0.24 g (yield of 56%) was obtained.

2. The Fabrication of Device

Figure 6:
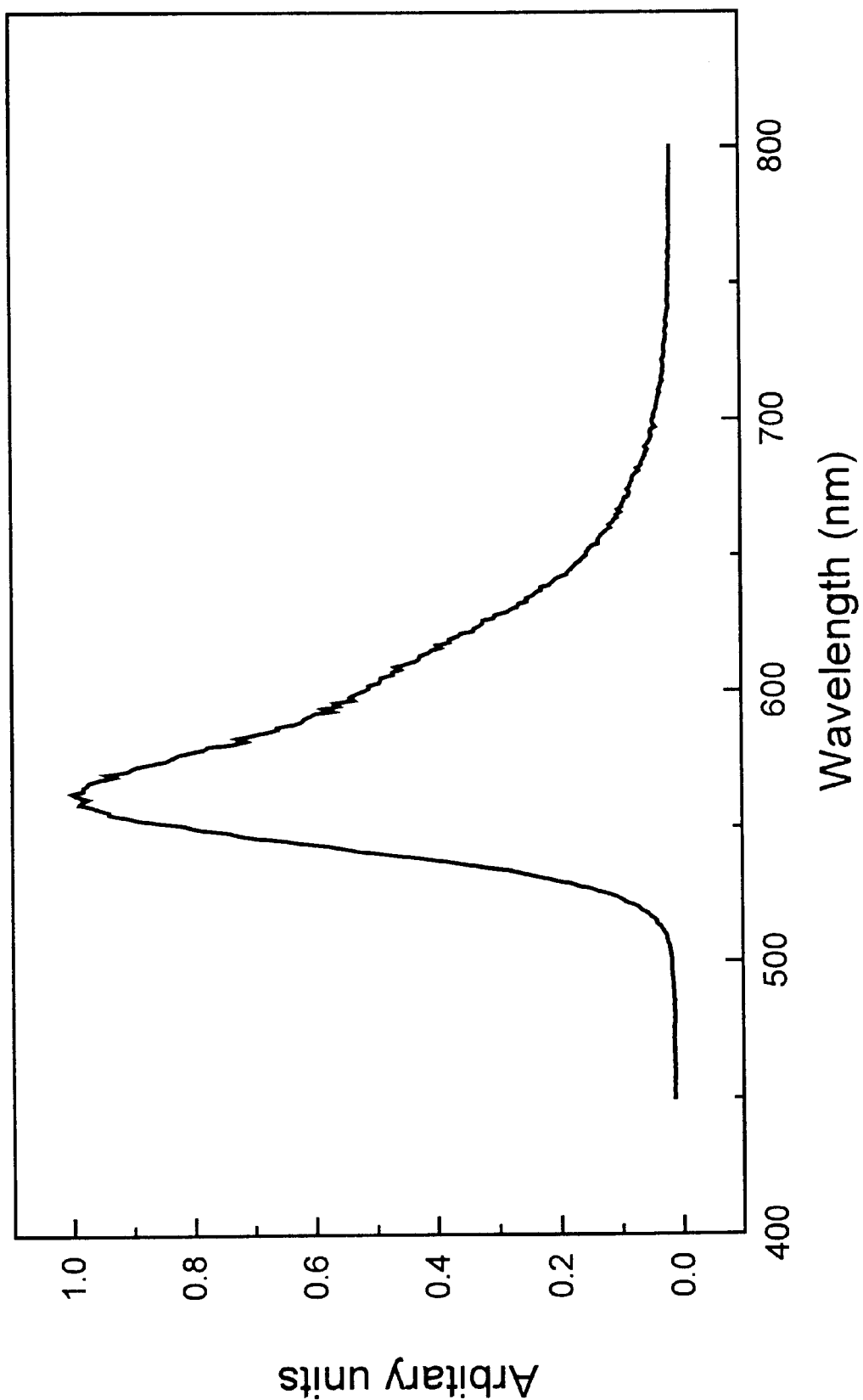
FIG. 6. The electroluminescent spectrum of conjugated POPD-MEH-PPV (80/20) copolymer of this invention.
Figure 7:
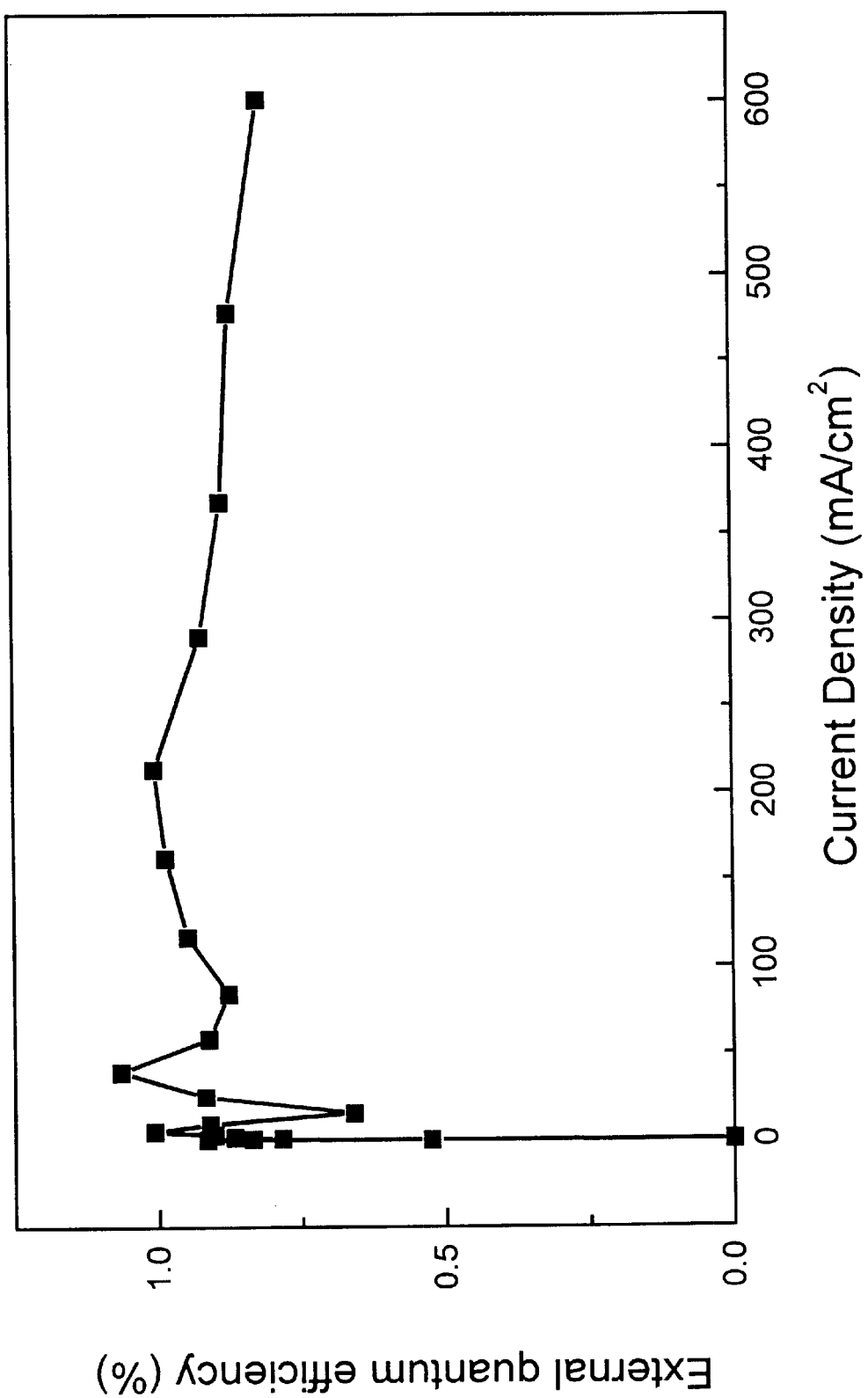
FIG. 7. The plot of external quantum efficiency vs. current density of ITO/POPD-MEH-PPV(80/20)/Ca/AI PLED of this invention.

A single layer PLED was fabricated by using POPD-MEH-PPV (80/20) (polymer 13) (5 mg/mL in chloroform) according to the procedures described in Control Example 2. Yellow emissive light was observed by applying a forward bias of about 2.5 V. It showed maximum external quantum efficiency of 1.07% and maximum brightness of over 5000 cd/m$^2$. FIG. 6 shows the electroluminescent spectrum of POPD-MEH-PPV (80/20). FIG. 7 shows the relationship between current density and external quantum efficiency. It can be seen from this example that the copolymer synthesized in this example provided a surprisingly higher device efficiency in comparison with those in Control Example 2 and Example 3. Its efficiency was 13.3 times higher than that of MEH-PPV, and 4.1 times higher than that of POPD-PPV.

In other similar examples, the inventors synthesized copolymers of POPD-MEH-PPV with the x/y ratios of 60/40 and 40/60. The procedures described in Control Example 2 were used to fabricate single layer PLED devices. The results show that the maximum external quantum efficiency is 1.19 for the former copolymer and is upto 1.52 for the latter.

EXAMPLE 5
The Preparation of Poly[1,10-decanedioxy-2,6-dimethoxy-1,4-phenylene-1,2-ethenylene-2-(2'-(p-(5"-phenyl-1",3",4"-oxadiazole-2"-yl)phenoxy)ethanoxy)-1,4-phenylene-1,2-ethenylene-3,5-dimethoxy-1,4-phenylene] (POPEPPVC$_{10}$) and Fabrication of a LED Device Containing the Same 1. Synthesis (Shown in Scheme 4; the Syntheses of Starting Materials are the Same as in Example 1)
Preparation of 2-(2'-(p-(5"-Phenyl-1",3",4"-oxadiazole-2"-yl)phenoxy)ethanoxy) 1,4-Xylene]bis (triphenylphosphonium Bromide) (14)
4 g (7.35 mmol) of 2-(2'-(p-(5"-phenyl-1",3",4"-oxadiazole-2"-yl)phenoxy)ethanoxy) 1,4-bis(bromomethyl) benzene and 4.82 g (18.4 mmol) of triphenyl phosphine were added to 100 mL DMF under nitrogen. Allowed to react at 120° C. for 11 hours. The reaction mixture was cooled to room temperature before adding thereto 200 mL of ethyl ether. The precipitate formed therein was collected by filtering and drying under vacuum. Dissolved in ethanol and precipitated by adding ethyl ether again. The precipitate was collected by filtering and drying under vacuum in the form of powder. $^1$H-NMR (CDCl$_3$, ppm): δ 8.14 (q, 2H), δ 8.09 (d, 2H), δ 7.8–7.4 (m, 30H), δ 7.26 (d, 1H), δ 6.98 (d, 2H), δ 6.3 (d, 1H), δ 5.34 (d, 2H), δ 5.21 (d, 2H), δ 3.83 (t, 2H), δ 3.62 (t, 2H).

Preparation of Poly[1,10-decanedioxy-2,6-dimethoxy-1,4-phenylene-1,2-ethenylene-2-(2'-(p-(5"-phenyl-1",3",4"-oxadiazole-2"-yl)phenoxy)ethanoxy)-1,4-phenylene-1,2-ethenylene-3,5-dimethoxy-1,4-phenylene] (POPEPPVC$_{10}$) (15)
2.4 g (2.25 mmol) of 2-(2'-(p-(5"-phenyl-1",3",4"-oxadiazole-2"-yl)phenoxy)ethanoxy) 1,4-xylene]bis (triphenylphosphonium bromide) and 1.13 g (2.25 mmol) of 1,10-bis(4-formyl-2,6-dimethoxyphenoxy)decane were dissolved in 60 mL mixed solvent of chloroform/ethanol (25/35 (v/v)) under nitrogen. To the resulting solution a solution of 0.124 g sodium in 15 mL ethanol was added dropwise for conducting a polymerization reaction. After finishing the addition of the base, the mixture was allowed to react at room temperature for 9 hours while stirring. 100 mL of di-chloromethane and 100 mL of water were used for extraction. The organic phase was collected and concentrated. The residue was dissolved in 10 mL of chloroform, and then methanol was added to form precipitate again. The precipitate was collected and dried under vacuum to yield POPEPPVC$_{10}$.

2. The Fabrication of Device

Figure 8:
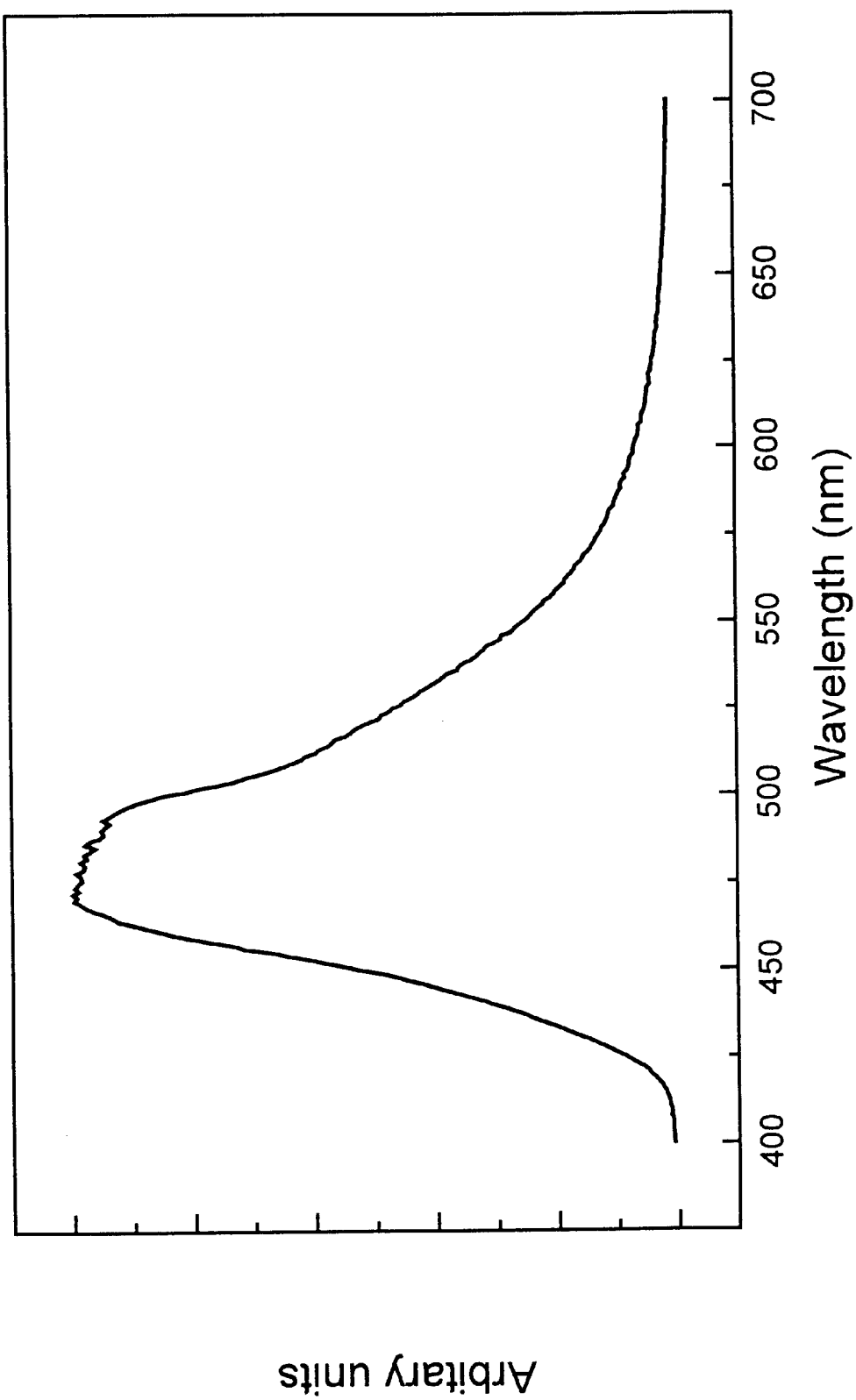
FIG. 8. The photoluminescent excitation spectrum of conjugated POPEPPVC$_{10}$ polymer of this invention.

A film of POPPEPPVC$_{10}$(polymer 15) was formed on an ITO/glass substrate by spin coating from its solution of 5 mg/mL in chloroform. The thickness of the resulting film was about 80 nm. A layer of In metal was deposited on the film by evaporation under a vacuum pressure of about 10$^{-5}$ Torr. Blue emissive light was observed by applying a forward bias of about 15 V. FIG. 8 shows the electroluminescent spectrum of POPEPPVCIO. It showed the maximum external quantum efficiency of 0.1% and the maximum brightness of over 20 cd/m$^2$. If the high electronegative moiety is not introduced into the side chains, the efficiency will be lower as shown in the following Example 6.

EXAMPLE 6
The Preparation of Poly[1,10-decanedioxy-2,6-dimethoxy-1,4-phenylene-1,2-ethenylene-2-ethanoxy-1,4-phenylene-1,2-ethenylene-3,5-dimethoxy-1,4-phenylene] (PEPVC$_{10}$) and the Fabrication of a LED Device Containing the Same 1. Synthesis (Shown in Scheme 4; the Syntheses of Monomers Being Similar to Those in Example 1, Except the Side Chain was Changed to Ethoxy)
Preparation of (2-Ethanoxy 1,4-Xylene) bis (triphenylphosphonium Bromide) (16)
2.32 g (7.53 mmol) of 2-ethanoxy 1,4-bis(bromomethyl) benzene and 4.93 g (18.8 mmol) triphenyl phosphine were added to 100 mL of dimethyl foramide under nitrogen, and refluxed at 120° C. for 14 hours. After cooling the reaction mixture to room temperature, 200 mL of ethyl ether was added. The precipitate formed therein was collected by filtering and drying under vacuum. Dissolved in ethanol and precipitated by adding ethyl ether again. The precipitate was collected by filtering and drying under vacuum in the form of white powder. $^1$H-NMR (DMSO-d$_6$, ppm): δ 7.85 (m, 6H), δ 7.6 (m, 24H), δ 6.8 (d, 1H), δ 6.39 (s, 1H). δ 6.32 (d, 1H), δ 5.1 (d, 2H), δ 4.83 (d, 2H), δ 3.02 (q, 2H), δ 0.72 (t, 3H).

Preparation of Poly[1,10-decanedioxy-2,6-dimethoxy-1,4-phenylene-1,2-ethylene-2-ethanoxy-1,4-phenylene-1,2-ethenylene-3,5-dimethoxy-1,4-phenylene] (PEPVC$_{10}$) (17)

2.74 g (3.29 mmol) of (2-ethanoxy 1,4-xylene) bis (triphenyl phosphonium bromide) and 1.65 g (3.29 mmol) of 1,10-bis(4-formyl-2,6-dimethoxyplenoxy)decane were dissolved in 60 mL of a solvent mixture of chloroform and ethanol (25/35 (v/v) under nitrogen. To the resulting solution a solution of 0.182 g sodium in 20 mL ethanol was added dropwise conducting a polymerization reaction. After finishing the addition of the base, the mixture was allowed to react at room temperature for 9 hours while stirring. 100 mL of di-chloromethane and 100 mL of water were used for extraction. The organic phase was collected and concentrated. The residue was dissolved in 10 mL of chloroform, and ethanol was added to form precipitate again. The precipitate was collected by drying under vacuum overnight to yield $PEPVC_{10}$.

2. The Fabrication of Component

Figure 9:
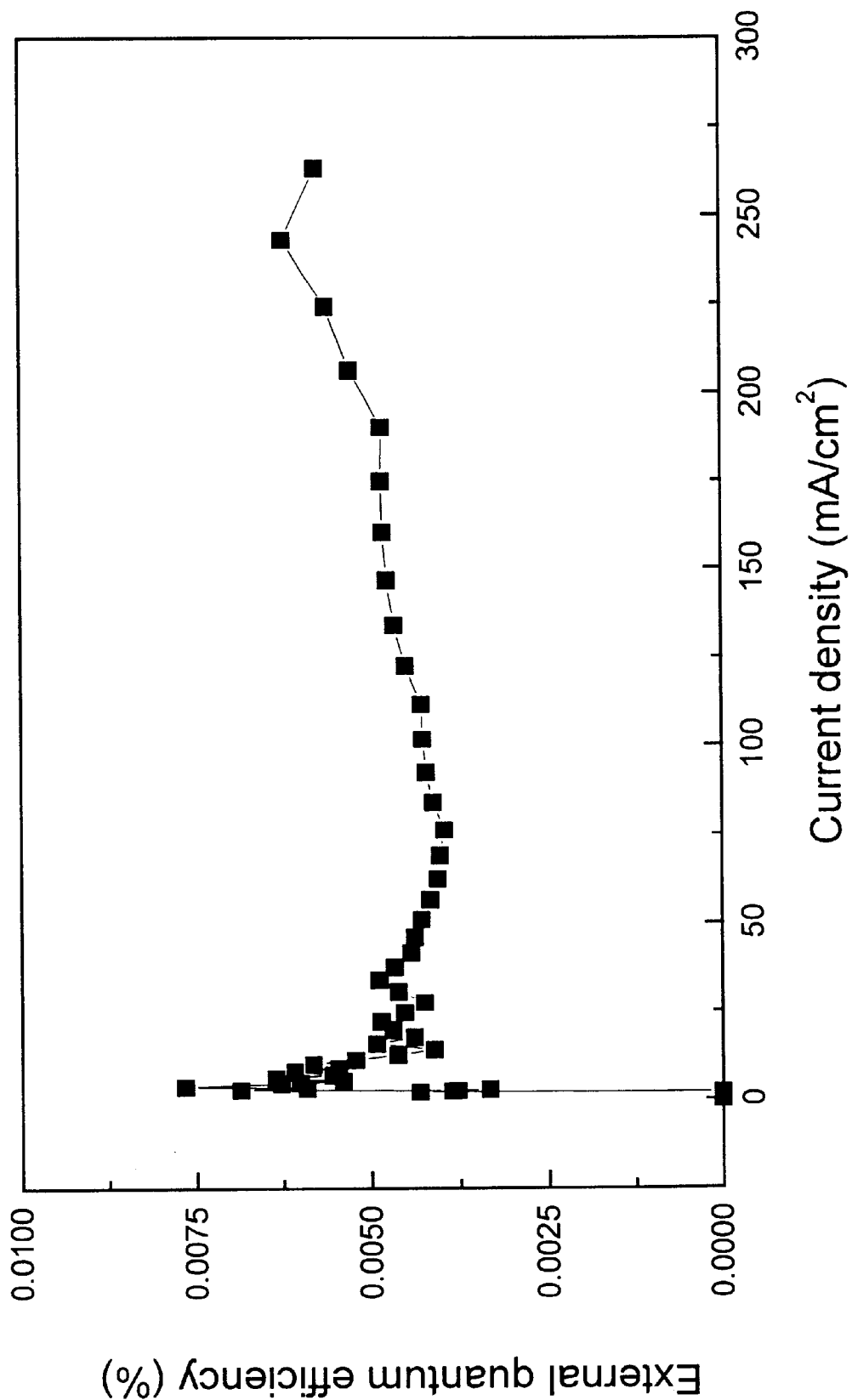
FIG. 9. The plot of external quantum efficiency vs. current density of ITO/PEPVC$_{10}$/In PLED of this invention.

A film of $PEPVC_{10}$ (polymer 17) was formed on an ITO/glass substrate by spin coating from its solution of 5 mg/mL in chloroform. The thickness of the resulting film was about 50 nm. A layer of In metal was deposited on the film by evaporation under a vacuum pressure of about $10^{-5}$ Torr. Blue emissive light was observed by applying a forward bias of about 7 V. It showed the maximum external quantum efficiency of 0.0076% and the maximum brightness of about 8 $cd/m^2$. FIG. 9 shows the relationship between the current density and external quantum efficiency of this device.

What is claimed is:

1. An electroluminescent conjugated polymer modified with a high electronegative heterocyclic group having an unit of the following formula (I):

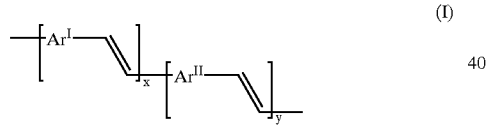

(I)

in which $0<x\leq1$, $0\leq y<1$, and $x+y=1$; and $Ar^I$ and $Ar^{II}$ independently are a divalent aromatic group selected from the group consisting of benzene, naphthalene, anthracene, fluorene, thiophene, furan, pyridine, 2,5-di-aryl-1,3,4-oxadiozole-diyl, 2,5-di-aryl-1,3,4-thiadiazole-diyl, 3,5-di-aryl-4-alkoxyaryl-1,2,4-triazole-diyl and a combination of each other, wherein $Ar^{II}$ has one or more substituent selected from the group consisting of $C_1$~$C_{20}$ alkyl, $C_1$~$C_{22}$ alkoxy, phenyl, phenoxy, halogen, perfluoromethyl, cyano, silane, siloxane, and a combination of each other; and $Ar^I$ contains at least one substituent of —$R^sR^h$, wherein $R^h$ comprises a heterocyclic moiety of oxidiazole, thiadiazole or triazole or a mixture of each other; and —$R^s$ is a divalent group selected from the group consisting of —O—, —S—, —$OR^{II}O$—, —$OR^{II}S$—, —$SR^{II}S$—, and —$R^{II}$—, wherein $R^{II}$ is $C_1$~$C_{20}$ alkylene or $C_6$~$C_{20}$ arylene;

wherein $R^{II}$ is $C_{10}$~$C_{20}$ alkylene or $C_6$~$C_{20}$ arylene, when y=0 and —$R^s$ is —$OR^{II}O$—.

2. The conjugated polymer according to claim 1, wherein $R^h$ group has one of the following formulas:

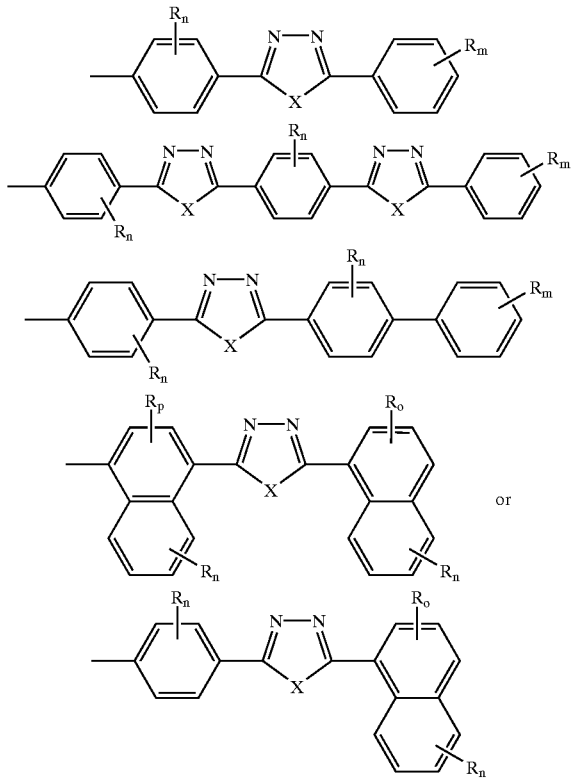

in which m=1~5, n=1~4, o=1~3, p=1~2; R is hydrogen, $C_1$~$C_{22}$ alkyl or $C_1$~$C_{22}$ alkoxy, and substituents on the same cyclic ring structure can be identical or different; X=O, S, or N—$R^I$, wherein $R^I$ is selected from the group consisting of $C^1$~$C_{22}$ alkyl, $C^1$~$C_{22}$ alkoxy, phenyl, alkyl phenyl having $C_7$~$C_{28}$, alkoxy phenyl having $C_7$~$C_{28}$, phenoxy, alkyl phenoxy having $C_7$~$C_{28}$, alkoxy phenoxy having $C_7$~$C_{28}$, biphenyl, biphenylyloxy, alkyl biphenyl having $C_{13}$~$C_{34}$, alkoxy biphenyl having $C_{13}$~$C_{34}$, alkyl biphenylyloxy having $C_{13}$~$C_{34}$ and alkoxy biphenylyloxy having $C_{13}$~$C_{34}$.

3. The conjugated polymer according to claim 1, wherein vinylene groups of the formula (I) independently have one substituent selected from the group consisting of hydrogen, $C_1$~$C_{22}$ alkyl, $C_1$~$C_{22}$ alkoxy, $C_6$~$C_{28}$ arylene, cyano, and perfluoromethyl.

4. The conjugated polymer according to claim 1, wherein y>0.

5. The conjugated polymer according to claim 1, wherein —$R^s$ is —$OR^{II}O$— and $R^{II}$ is $C_1$~$C_{20}$ alkylene.

6. The conjugated polymer according to claim 4, wherein —$R^s$ is —$OR^{II}O$— and $R^{II}$ is $C_1$~$C_{20}$ alkylene.

7. The conjugated polymer according to claim 1, wherein $R^h$ is

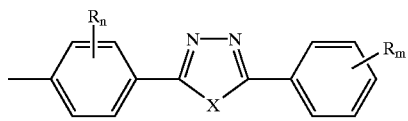

wherein m=1~5, n=1~4, R is hydrogen, $C_1$~$C_{22}$ alkyl or $C_1$~$C_{22}$ alkoxy, and substituents on the same cyclic ring structure can be identical or different; X is O, S, or N—$R^I$, wherein $R^I$ is selected from the group consisting of $C_1$~$C_{22}$ alkyl, $C_1$~$C_{22}$ alkoxy, phenyl, alkyl phenyl having $C_7$~$C_{28}$, alkoxy phenyl having $C_7$~$C_{28}$, phenoxy, alkyl phenoxy having $C_7$~$C_{28}$, alkoxy phenoxy having $C_7$~$C_{28}$, biphenyl, biphenylyloxy, alkyl biphenyl having $C_{13}$~$C_{34}$, alkoxy biphenyl having $C_{13}$~$C_{34}$, alkyl biphenylyloxy having $C_{13}$~$C_{34}$ and alkoxy biphenylyloxy having $C_{13}$~$C_{34}$.

8. The conjugated polymer according to claim 5, wherein $R^h$ is

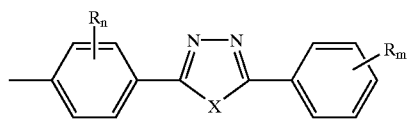

wherein m=1~5, n=1~4, R is hydrogen, $C_1$~$C_{22}$ alkyl or $C_1$~$_{22}$ alkoxy, and substituents on the same cyclic ring structure can be identical or different; X is O, S, or N—$R^I$, wherein $R^I$ is selected from the group consisting of $C_1$~$C_{22}$ alkyl, $C_1$~$C_{22}$ alkoxy, phenyl, alkyl phenyl having $C_7$~$C_{28}$, alkoxy phenyl having $C_7$~$C_{28}$, phenoxy, alkyl phenoxy having $C_7$~$C_{28}$, alkoxy phenoxy having $C_7$~$C_{28}$, biphenyl, biphenylyloxy, alkyl biphenyl having $C_{13}$~$C_{34}$, alkoxy biphenyl having $C_{13}$~$C_{34}$, alkyl biphenylyloxy having $C_{13}$~$C_{34}$ and alkoxy biphenylyloxy having $C_{13}$~$C_{34}$.

9. The conjugated polymer according to claim 6, wherein $R^h$ is

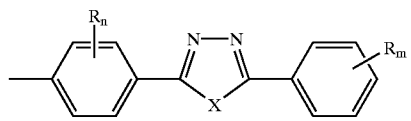

wherein m=1~5, n=1~4, R is hydrogen, $C_1$~$C_{22}$ alkyl or $C_1$~$C_{22}$ alkoxy, and substituents on the same cyclic ring structure can be identical or different; X is O, S, or N—$R^I$, wherein $R^I$ is selected from the group consisting of $C_1$~$C_{22}$ alkyl, $C_1$~$C_{22}$ alkoxy, phenyl, alkyl phenyl having $C_7$~$C_{28}$, alkoxy phenyl having $C_7$~$C_{28}$, phenoxy, alkyl phenoxy having $C_7$~$C_{28}$, alkoxy phenoxy having $C_7$~$C_{28}$, biphenyl, biphenylyloxy, alkyl biphenyl having $C_{13}$~$C_{34}$, alkoxy biphenyl having $C_{13}$~$C_{34}$, alkyl biphenylyloxy having $C_{13}$~$C_{34}$ and alkoxy biphenylyloxy having $C_{13}$~$C_{34}$.

10. The conjugated polymer according to claim 2, wherein R is hydrogen and X is oxygen.

11. The conjugated polymer according to claim 1, wherein $Ar^I$ and $Ar^{II}$ independently are phenylene having one or more substituent which is not hydrogen.

12. The conjugated polymer according to claim 4, wherein $Ar^I$ and $Ar^{II}$ independently are phenylene having one or more substituent which is not hydrogen.

13. The conjugated polymer according to claim 11, wherein $Ar^I$ has one substituent which is not hydrogen, and —$R^s$ is —$OR^{II}O$— and $R^{II}$ is $C_1$~$C_{20}$ alkylene.

14. The conjugated polymer according to claim 12, wherein $Ar^I$ has one substituent which is not hydrogen, and —$R^s$ is —$OR^{II}O$— and $R^{II}$ is $C_1$~$C_{20}$ alkylene.

15. The conjugated polymer according to claim 13, wherein $R^h$ is

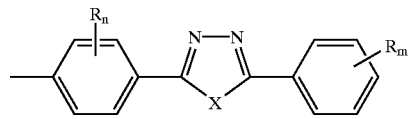

wherein m=1~5, n=1~4, R is hydrogen, $C_1$~$C_{22}$ alkyl or $C_1$~$C_{22}$ alkoxy, and substituents on the same cyclic ring structure can be identical or different; X is O, S, or N—$R^I$, wherein $R^I$ is selected from the group consisting of $C_1$~$C_{22}$ alkyl, $C_1$~$C_{22}$ alkoxy, phenyl, alkyl phenyl having $C_7$~$C_{28}$, alkoxy phenyl having $C_7$~$C_{28}$, phenoxy, alkyl phenoxy having $C_7$~$C_{28}$, alkoxy phenoxy having $C_7$~$C_{28}$, biphenyl, biphenylyloxy, alkyl biphenyl having $C_{13}$~$C_{34}$, alkoxy biphenyl having $C_{13}$~$C_{34}$, alkyl biphenylyloxy having $C_{13}$~$C_{34}$ and alkoxy biphenylyloxy having $C_{13}$~$C_{34}$.

16. The conjugated polymer according to claim 14, wherein $R^h$ is

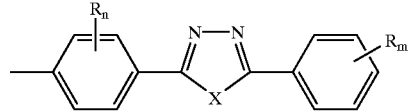

wherein m=1~5, n=1~4, R is hydrogen, $C_1$~$C_{22}$ alkyl or $C_1$~$C_{22}$ alkoxy, and substituents on the same cyclic ring structure can be identical or different; X is O, S, or N—$R^I$, wherein $R^I$ is selected from the group of $C_1$~$C_{22}$ alkyl, $C_1$~$C_{22}$ alkoxy, phenyl, alkyl phenyl having $C_7$~$C_{28}$, alkoxy phenyl having $C_7$~$C_{28}$, phenoxy, alkyl phenoxy having $C_7$~$C_{28}$, alkoxy phenoxy having $C_7$~$C_{28}$, biphenyl, biphenylyloxy, alkyl biphenyl having $C_{13}$~$C_{34}$, alkoxy biphenyl having $C_{13}$~$C_{34}$, alkyl biphenylyloxy having $C_{13}$~$C_{34}$ and alkoxy biphenylyloxy having $C_{13}$~$C_{34}$.

17. The conjugated polymer according to claim 16, wherein $Ar^{II}$ has two substituents which are not hydrogen, wherein one of the two substituents is methoxy and the other one is 2-ethylhexoxy (—$OCH_2CH(C_2H_5)C_4H_9$).

18. The conjugated polymer according to claim 15, wherein R is hydrogen and X is oxygen.

19. The conjugated polymer according to claim 16, wherein R is hydrogen and X is oxygen.

20. The conjugated polymer according to claim 17, wherein R is hydrogen and X is oxygen.

21. The conjugated polymer according to claim 4, wherein $0.2 \leq y \leq 0.6$.

22. An electroluminescent conjugated copolymer modified with a high electronegative heterocyclic group having the following formula (III):

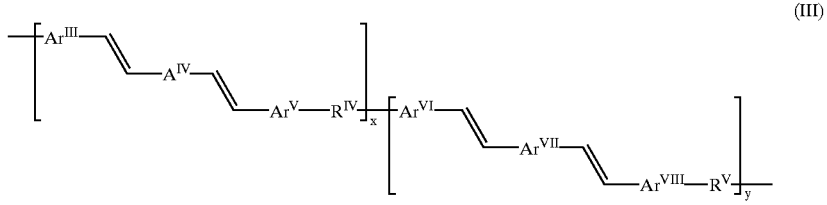
(III)

in which 0≦x≦1, 0≦y≦1, and x+y=1; $Ar^{III}$, $Ar^{IV}$, $Ar^V$, $Ar^{VI}$, $Ar^{VII}$, and $Ar^{VIII}$ independently are a divalent aromatic group selected from the group consisting of benzene, naphthalene, anthracene, fluorene, thiophene, furan, pyridine, 2,5-di-aryl-1,3,4-oxadiozole-diyl, 2,5-di-aryl-1,3,4-thiadiazole-diyl, 3,5-di-aryl-4-alkoxyaryl-1,2,4-triazole-diyl and a combination of each other, wherein $Ar^{III}$, $Ar^{IV}$, $Ar^V$, $Ar^{VI}$, $Ar^{VII}$, and $Ar^{VIII}$ optionally has one or more substituents selected from the group consisting of $C_1$~$C_{20}$ alkyl, $C_1$~$C_{22}$ alkoxy, phenyl, phenoxy, halogen, perfluoromethyl, cyano, silane, siloxane, and a combination of each other; and at least one of $Ar^{III}$, $Ar^{IV}$, $Ar^V$, $Ar^{VI}$, $Ar^{VII}$ and $Ar^{VIII}$ contains one substituent of —$R^sR^h$, wherein $R^h$ comprises a heterocyclic moiety of oxidiazole, thiadiazole or triazole or a mixture of each other; and —$R^s$ is a divalent group selected from the group consisting of —O—, —S—, —$OR''O$—, —$OR''S$—, —$SR''S$—, or —$R''$—, wherein $R''$ is $C_1$~$C_{20}$ alkylene or $C_6$~$C_{20}$ arylene; and $R^{IV}$ and $R^V$ independently are a divalent, group selected from —O—, —NH—, —$CO_2R''O_2C$—, —$O_2CR''CO_2$—, —S—, —$OR''O$—, —$OR''S$—, —$SR''S$—, —$OR''$—, and —$R''$—, wherein $R''$ is defined as above.

23. The conjugated polymer according to claim 22, wherein $R^h$ group has one of the following formulas:

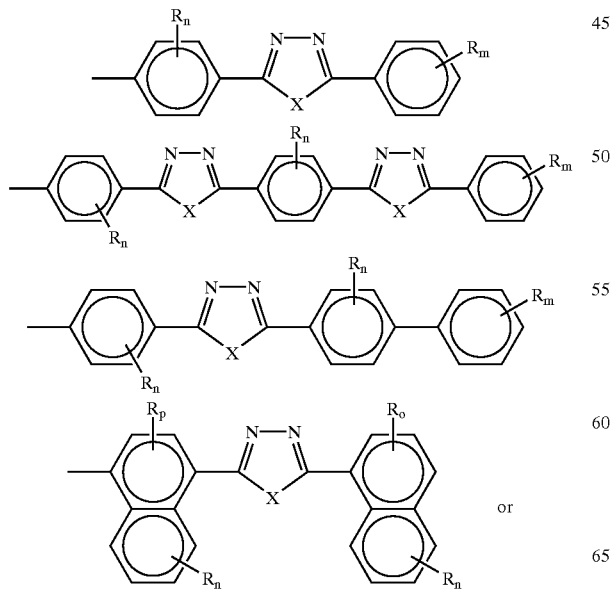

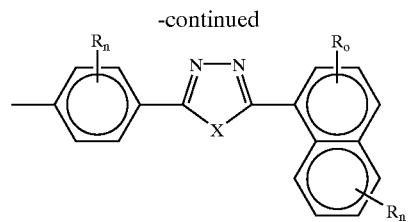

in which m=1~5, n=1~4, o=1~3, p1~2; R is hydrogen, $C_1$~$C_{22}$ alkyl or $C_1$~$C_{22}$ alkoxy, and substituents on the same cyclic ring structure can be identical or different; X is O, S, or N—$R^I$, wherein $R^I$ is selected from the group consisting of $C_1$~$C_{22}$ alkyl, $C_1$~$C_{22}$ alkoxy, phenyl, alkyl phenyl having $C_7$~$C_{28}$, alkoxy phenyl having $C_7$~$C_{28}$, phenoxy, alkyl phenoxy having $C_7$~$C_{28}$, alkoxy phenoxy having $C_7$~$C_{28}$, biphenyl, biphenylyloxy, alkyl biphenyl having $C_{13}$~$C_{34}$, alkoxy biphenyl having $C_{13}$~$C_{34}$, alkyl biphenylyloxy having $C_{13}$~$C_{34}$ and alkoxy biphenylyloxy having $C_{13}$~$C_{34}$.

24. The conjugated polymer according to claim 22, wherein vinylene groups of the formula (III) independently have one substituent selected from the group consisting of hydrogen, $C_1$~$C_{22}$ alkyl, $C_1$~$C_{22}$ alkoxy, $C_6$~$C_{28}$ arylene, cyano, and perfluoromethyl.

25. The electroluminescent conjugated copolymer according to claim 22, wherein y=0 and at least one of $Ar^{III}$, $Ar^{IV}$ and $Ar^V$ contains at least one substituent of —$R^sR^h$.

26. The conjugated copolymer according to claim 22, wherein —$R^s$ is —$OR''O$— and $R''$ is $C_1$~$C_{20}$ alkylene.

27. The conjugated copolymer according to claim 22, wherein —$R^s$ is —$OR''O$— and $R''$ is $C_1$~$C_{20}$ alkylene.

28. The conjugated polymer according to claim 22, wherein $R^h$ is

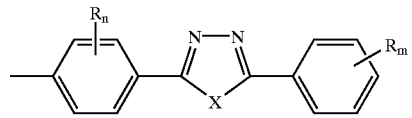

wherein m=1~5, n=1~4, R is hydrogen, $C_1$~$C_{22}$ alkyl or $C_1$~$C_{22}$ alkoxy, and substituents on the same cyclic ring structure can be identical or different; X is O, S, or N—$R^I$, wherein $R^I$ is selected from the group consisting of $C_1$~$C_{22}$ alkyl, $C_1$~$C_{22}$ alkoxy, phenyl, alkyl phenyl having $C_7$~$C_{28}$, alkoxy phenyl having $C_7$~$C_{28}$, phenoxy, alkyl phenoxy having $C_7$~$C_{28}$, alkoxy phenoxy having $C_7$~$C_{28}$, biphenyl, biphenylyloxy, alkyl biphenyl having $C_{13}$~$C_{34}$, alkoxy biphenyl having $C_{13}$~$C_{34}$, alkyl biphenylyloxy having $C_{13}$~$C_{34}$ and alkoxy biphenylyloxy having $C_{13}$~$C_{34}$.

29. The conjugated polymer according to claim 26, wherein $R^h$ is or

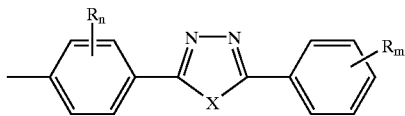

wherein m=1~5, n=1~4, R is hydrogen, $C_1$~$C_{22}$ alkyl or $C_1$~$C_{22}$ alkoxy, and substituents on the same cyclic ring structure can be identical or different; X is O, S, or N—$R^I$, wherein $R^I$ is selected from the group consisting of $C_1$~$C_{22}$ alkyl, $C_1$~$C_{22}$ alkoxy, phenyl, alkyl phenyl having $C_7$~$C_{28}$, alkoxy phenyl having $C_7$~$C_{28}$, phenoxy, alkyl phenoxy having $C_7$~$C_{28}$, alkoxy phenoxy having $C_7$~$C_{28}$, biphenyl, biphenylyloxy, alkyl biphenyl having $C_{13}$~$C_{34}$, alkoxy biphenyl having $C_{13}$~$C_{34}$, alkyl biphenylyloxy having $C_{13}$~$C_{34}$ and alkoxy biphenylyloxy having $C_{13}$~$C_{34}$.

30. The conjugated polymer according to claim 27, wherein $R^h$ is

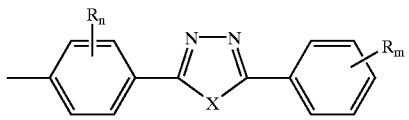

wherein m=1~5, n=1~4, R is hydrogen, $C_1$~$C_{22}$ alkyl or $C_1$~$C_{22}$ alkoxy, and substituents on the same cyclic ring structure can be identical or different; X is O, S, or N—$R^I$, wherein $R^I$ is selected from the group consisting of $C_1$~$C_{22}$ alkyl, $C_1$~$C_{22}$ alkoxy, phenyl, alkyl phenyl having $C_7$~$C_{28}$, alkoxy phenyl having $C_7$~$C_{28}$, phenoxy, alkyl phenoxy having $C_7$~$C_{28}$, alkoxy phenoxy having $C_7$~$C_{28}$, biphenyl, biphenylyloxy, alkyl biphenyl having $C_{13}$~$C_{34}$, alkoxy biphenyl having $C_{13}$~$C_{34}$, alkyl biphenylyloxy having $C_{13}$~$C_{34}$ and alkoxy biphenylyloxy having $C_{13}$~$C_{34}$.

31. The conjugated copolymer according to claim 23, wherein R is hydrogen and X is oxygen.

32. The conjugated copolymer according to claim 22, wherein y>0, $Ar^{III}$ and $Ar^{VI}$ are identical, $Ar^V$ and $Ar^{VIII}$ are identical, and $R^{IV}$ and $R^V$ are identical.

33. The conjugated copolymer according to claim 25, wherein $Ar^{IV}$ has the substituent of —$R^sR^h$, wherein —$R^s$ is —$OR^{II}O$— and $R^{II}$ is $C_1$~$C_{20}$ alkylene.

34. The conjugated copolymer according to claim 32, wherein $Ar^{IV}$ has the substituent of —$R^sR^h$, wherein —$R^s$ is —$OR^{II}O$— and $R^{II}$ is $C_1$~$C_{20}$ alkylene.

35. The conjugated polymer according to claim 33, wherein $R^h$ is

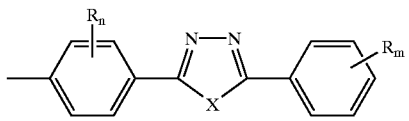

wherein m=1~5, n=1~4, R is hydrogen, $C_1$~$C_{22}$ alkyl or $C_1$~$C_{22}$ alkoxy, and substituents on the same cyclic ring structure can be identical or different; X is O, S, or N—$R^I$, wherein $R^I$ is selected from the group consisting of $C_1$~$C_{22}$ alkyl, $C_1$~$C_{22}$ alkoxy, phenyl, alkyl phenyl having $C_7$~$C_{28}$, alkoxy phenyl having $C_7$~$C_{28}$, phenoxy, alkyl phenoxy having $C_7$~$C_{28}$, alkoxy phenoxy having $C_7$~$C_{28}$, biphenyl, biphenylyloxy, alkyl biphenyl having $C_{13}$~$C_{34}$, alkoxy biphenyl having $C_{13}$~$C_{34}$, alkyl biphenylyloxy having $C_{13}$~$C_{34}$ and alkoxy biphenylyloxy having $C_{13}$~$C_{34}$.

36. The conjugated polymer according to claim 34, wherein $R^h$ is

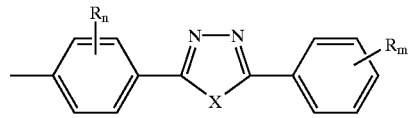

wherein m=1~5, n=1~4, R is hydrogen, $C_1$~$C_{22}$ alkyl or $C_1$~$C_{22}$ alkoxy, and substituents on the same cyclic ring structure can be identical or different; X is O, S, or N—$R^I$, wherein $R^I$ is selected from the group consisting of $C_1$~$C_{22}$ alkyl, $C_1$~$C_{22}$ alkoxy, phenyl, alkyl phenyl having $C_7$~$C_{28}$, alkoxy phenyl having $C_7$~$C_{28}$, phenoxy, alkyl phenoxy having $C_7$~$C_{28}$, alkoxy phenoxy having $C_7$~$C_{28}$, biphenyl, biphenylyloxy, alkyl biphenyl having $C_{13}$~$C_{34}$, alkoxy biphenyl having $C_{13}$~$C_{34}$, alkyl biphenylyloxy having $C_{13}$~$C_{34}$ and alkoxy biphenylyloxy having $C_{13}$~$C_{34}$.

37. The conjugated copolymer according to claim 35, wherein $Ar^{III}$ and $Ar^V$ independently are phenylene having one or two substituent of $C_1$~$C_8$ alkoxy.

38. The conjugated copolymer according to claim 36, wherein $Ar^{III}$, $Ar^V$ and $Ar^{VII}$ independently are phenylene having one or two substituent of $C_1$~$C_8$ alkoxy.

39. The conjugated copolymer according to claim 37, wherein $Ar^{III}$ and $Ar^V$ are phenylene having two methoxy substituents.

40. The conjugated copolymer according to claim 38, wherein $Ar^{III}$ and $Ar^V$ are phenylene having two methoxy substituents, and $Ar^{VII}$ is phenylene having one ethoxy substituent.

41. The conjugated copolymer according to claim 35, wherein R is hydrogen and X is oxygen.

42. The conjugated copolymer according to claim 36, wherein R is hydrogen and X is oxygen.

43. The conjugated copolymer according to claim 35, wherein $R^{IV}$ is —$OR^{II}O$—, and $R^{II}$ is $C_1$~$C_{20}$ alkylene.

44. The conjugated copolymer according to claim 36, wherein $R^{IV}$ is —$OR^{II}O$—, and $R^{II}$ is $C_1$~$C_{20}$ alkylene.

45. The conjugated copolymer according to claim 37, wherein $R^{IV}$ is —$OR^{II}O$—, and $R^{II}$ is $C_1$~$C_{20}$ alkylene.

46. The conjugated copolymer according to claim 38, wherein $R^{IV}$ is —$OR^{II}O$—, and $R^{II}$ is $C_1$~$C_{20}$ alkylene.

47. The conjugated copolymer according to claim 39, wherein $R^{IV}$ is —$OR^{II}O$—, and $R^{II}$ is $C_1$~$C_{20}$ alkylene.

48. The conjugated copolymer according to claim 40, wherein $R^{IV}$ is —$OR^{II}O$—, and $R^{II}$ is $C_1$~$C_{20}$ alkylene.

* * * * *